United States Patent
Hirairi (12)

(10) Patent No.: US 6,496,041 B2
(45) Date of Patent: Dec. 17, 2002

(54) LOGIC CELL AND LOGIC CIRCUIT USING THE SAME

(75) Inventor: Koji Hirairi, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/771,969

(22) Filed: Jan. 30, 2001

(65) Prior Publication Data

US 2001/0013797 A1 Aug. 16, 2001

(30) Foreign Application Priority Data

Jan. 31, 2000 (JP) ........................................ 2000-027366

(51) Int. Cl.[7] ...................... H03K 19/094; H03K 19/096
(52) U.S. Cl. ............................. 326/113; 326/95; 326/17; 326/28
(58) Field of Search ............................. 326/113, 95, 98, 326/17, 21, 28, 112, 119

(56) References Cited

U.S. PATENT DOCUMENTS

| 5,491,653 | A |   | 2/1996 | Taborn |
| 5,550,490 | A |   | 8/1996 | Durham |
| 5,568,069 | A | * | 10/1996 | Chow ........................ 326/113 |
| 5,670,899 | A |   | 9/1997 | Kohdaka |
| 5,708,374 | A |   | 1/1998 | Durham |
| 6,108,805 | A | * | 8/2000 | Rajsuman ................... 714/724 |

OTHER PUBLICATIONS

Partovi H et al: "A Regenerative Push–Pull Differential Logic Family" Proceedings of the Spring Computer Society International Conference. (COMPCON), US, Los Alamitos, IEEE Comp. Soc. Press, vol. –, Feb. 28, 1994, pp. 280–285, XPOO0479403 ISBN: 0–8186–5380–9.

Kim H et al: "Design of Heuristic Algorithms Based on Shannon Expansion for Low–Power Logic Circuit Synsthesis" IEE Proceedings: Circuits Devices and Systems, GB, Institution of Electrical Engineers, Stenvenage, vol. 144, No. 6, Dec. 1, 1997, pp. 355–360, XPOO0767832 ISSN: 1350–2409.

* cited by examiner

Primary Examiner—Daniel D. Chang
(74) Attorney, Agent, or Firm—Rader, Fishman & Grauer PLLC; Ronald P. Kananen

(57) ABSTRACT

A logic cell capable of realizing a high speed logic operation without using a pipeline register and capable of realizing a simplification of the circuit structure and a lowering of the power consumption, and a logic circuit using the same, wherein an input register converts an input data to a two-wire code synchronous to a clock signal and supplies the same to a logic cell array, each logic cell of the logic cell array performs a predetermined logic operation, when an output code of a monitor cell changes to a valid logic code, an early completion detection signal output from a NOR gate becomes "L", the input register is reset in accordance with this, and the output becomes a blank code, the blank code is propagated by the logic cell array, and when the output of the monitor cell changes to the blank code, the output of the NOR gate becomes "H", the reset is released, and the input register supplies the input data to the logic cell array.

15 Claims, 24 Drawing Sheets

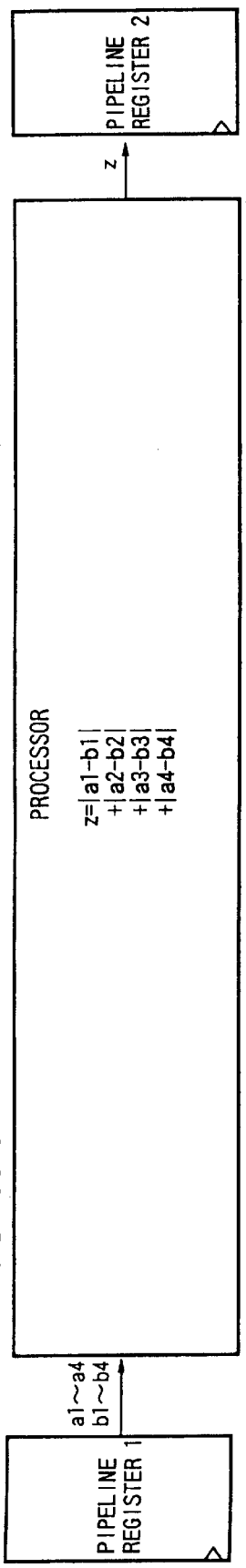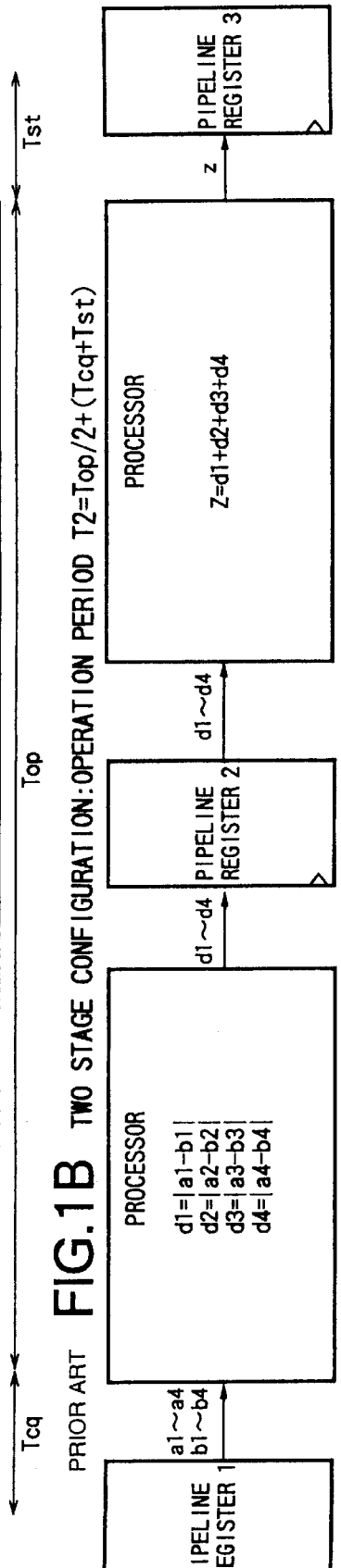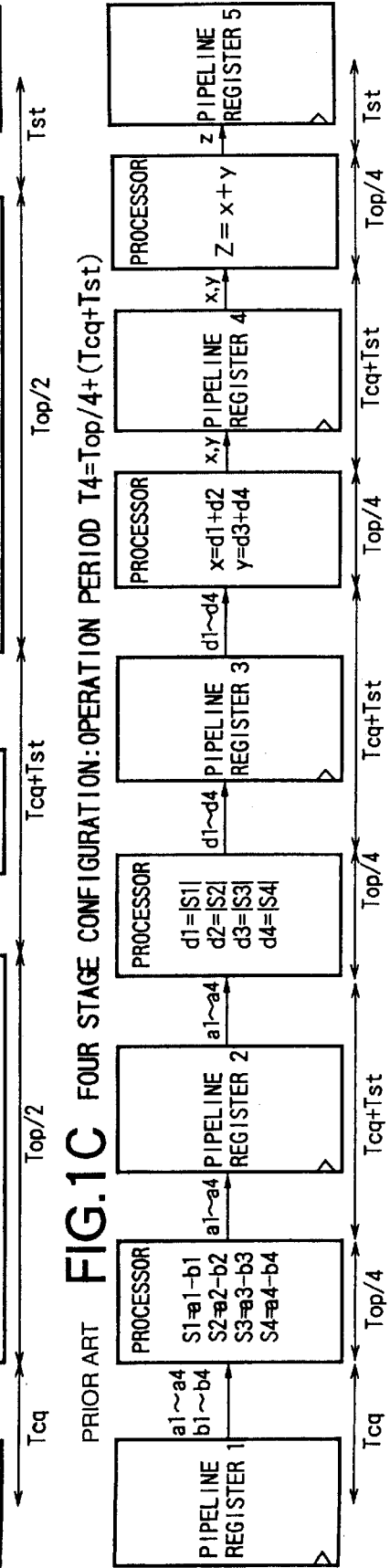

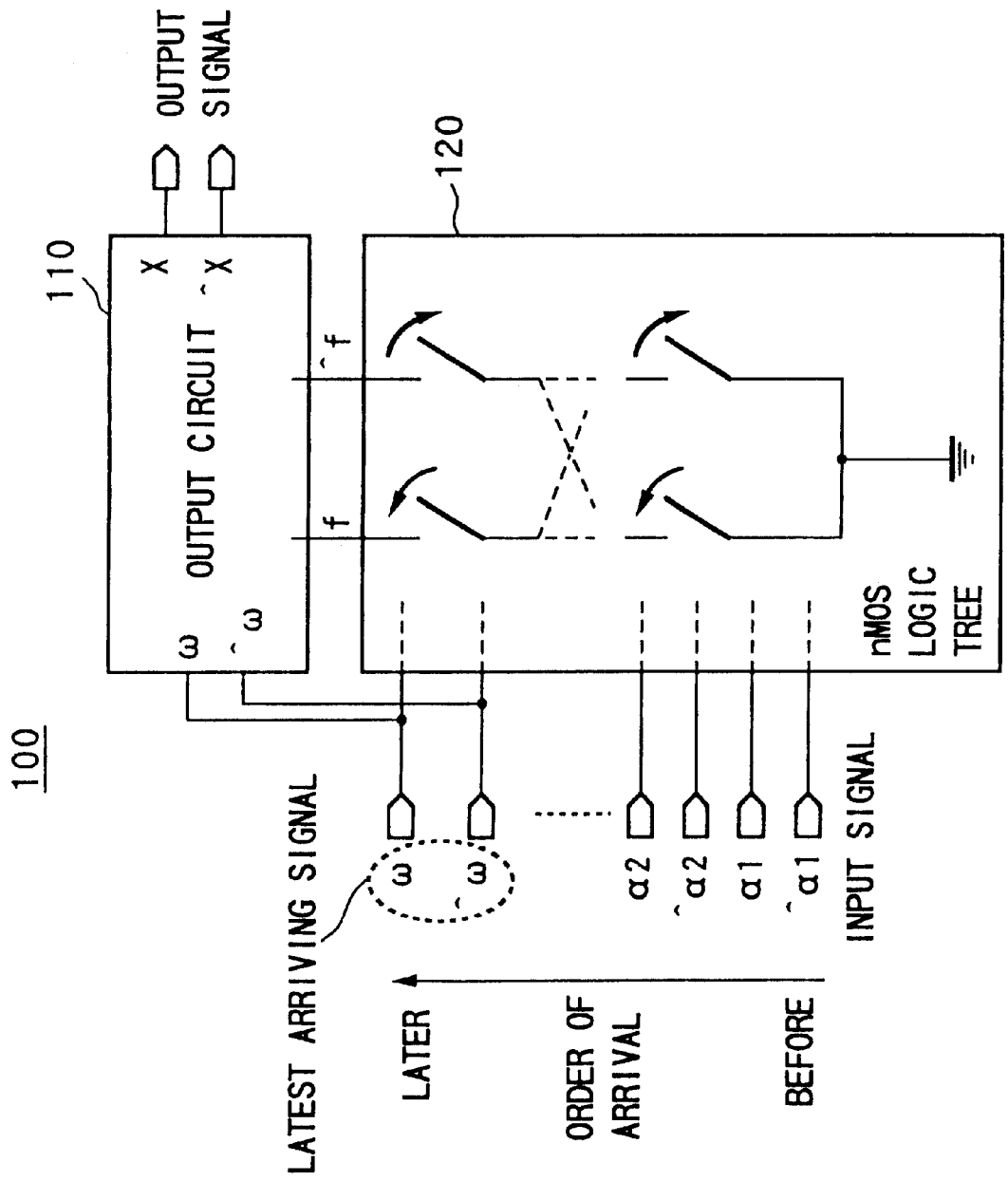

CONDITION OF SUITABLE LOGIC TREE IN PRESENT INVENTION

CONDITION 1
WHEN ω#=(0,0)
  f=^f=Z(HIGH IMPEDANCE)
CONDITION 2
TIME OTHER THAN WHEN ω#=(0,0)
  (f,^f)=(0,Z) or (Z,0)

UNSUITABLE LOGIC TREE

SUITABLE LOGIC TREE CORRECTED 3B

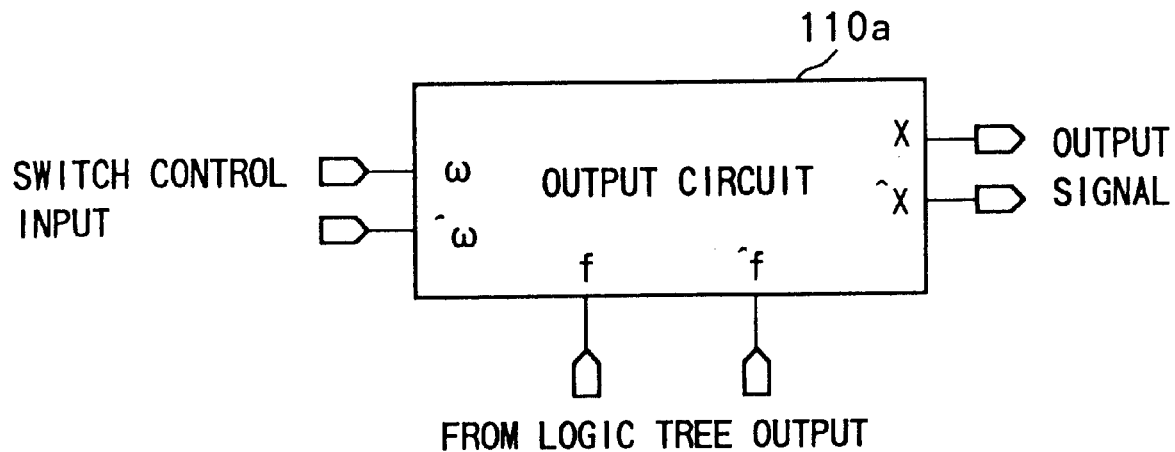

| ω | ˆω | f | ˆf | x | ˆx |
|---|---|---|---|---|---|
| 0 | 0 | Z | Z | MAINTAIN | |
| | | 0 | Z | PROHIBIT | |
| | | Z | 0 | | |
| 0 | 1 | Z | Z | MAINTAIN | |
| | | 0 | Z | 0 | 1 |
| | | Z | 0 | 1 | 0 |
| 1 | 0 | Z | Z | MAINTAIN | |
| | | 0 | Z | 0 | 1 |
| | | Z | 0 | 1 | 0 |

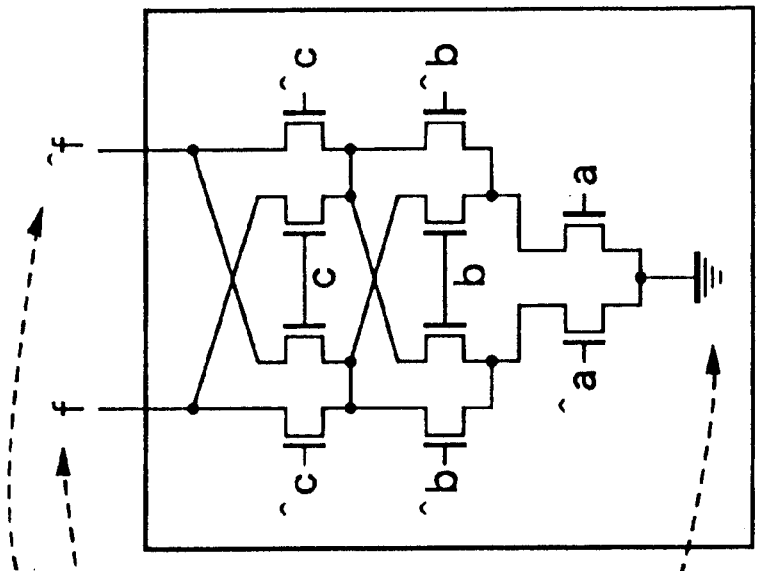
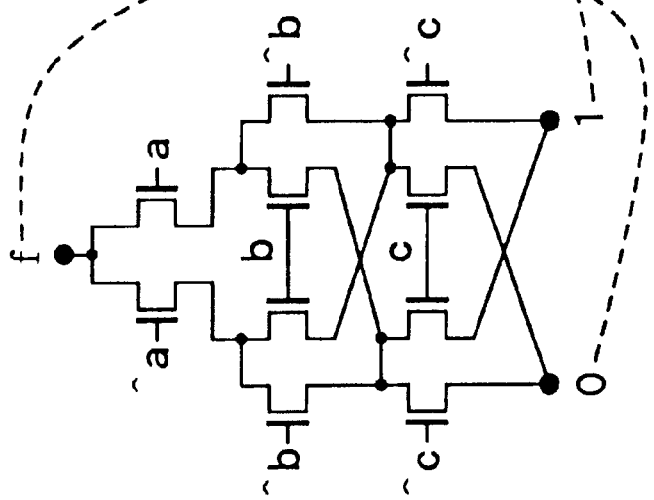
PRIOR ART
FIG.7A
PRIOR ART
FIG.7B

DIODE EQUIVALENT CIRCUIT WHEN ω#=(0, 0)

| HLD | D | X ~X |
|---|---|---|
| 0 | * | 0 0 |
| 0→1 | 0<br>1 | 0 1<br>1 0 |
| 0 | * | HOLD X# WHEN HLD 0→1 |

| RST | CK | NEXT HLD |
|---|---|---|
| 0 | * | 0 |
| 1 | 0 → 1 | 0 → 1 |
| 1 | OTHER | CURRENT HLD |

LOGIC CELL AND LOGIC CIRCUIT USING THE SAME

BACKGROUND OF THE INVENTION

1. Field of the Invention

The present invention relates to a logic cell and a logic circuit of a pipeline structure configured by using the logic cells, more particularly relates to a technique for raising the speed of a logic operation and lowering power consumption.

2. Description of the Related Art

A "data path pipeline" is the portion comprising the processors and pipeline registers in a processing block of a microprocessor. In order to realize operations at a high operating frequency, the general practice has been to divide the processors in the time direction and insert pipeline registers between the divided processors. One operation is executed over several cycles, but a new operation can be started at every cycle, so also operation results can be obtained at every cycle. Accordingly, if improving the operating frequency two-fold, the amount of operations possible in a certain time also doubles. In this way, the data path pipeline structure is a widely used technique for improvement of the operating speed and increase of the amount of operations.

FIGS. 1A to 1C show the configuration of a general data path pipeline. Here, as illustrated, the explanation will be made by taking as an example an operation for finding a cumulative sum of differential absolute values of data a1 to a4 and b1 to b4.

FIG. 1A shows the case where the operation is realized by a one-stage configuration processor. Here, it is assumed that the processor executes a required operation in a time $T_{op}$. When the operation is actually carried out, there are a time $T_{cq}$ until each pipeline register outputs valid data synchronous to a clock signal (generally also referred to as a "valid delay") and a time $T_{st}$ required for a pipeline register to fetch data (generally also referred to as a "setup time"). The operation period T1 therefore becomes (T1=$T_{op}$+$T_{cq}$+$T_{st}$)

As shown in FIG. 1B, when assuming that the operation process could be divided into exactly half in the time direction, the delay time of one processor becomes $T_{op}$/2 at most. However, $T_{cq}$ and $T_{st}$ of the pipeline registers inserted are constant so far as the same registers are used, so the operation period T2 becomes (T2=$T_{op}$/2+$T_{cq}$+$T_{st}$).

Similarly, as shown in FIG. 1C, where a four-stage configuration is employed, the operation period T4 becomes (T4=$T_{op}$/4+$T_{cq}$+$T_{st}$).

Summarizing the problems to be solved by the invention, the conventional logic circuit of a pipeline structure is always constrained by a delay ($T_{cq}$+$T_{st}$) possessed by the registers. For this reason, even if the number of stages of the pipeline is increased, a commensurate improvement of the operating frequency cannot be obtained. Further, in this example, it was assumed that, when dividing the processors, the process became exactly halved, but sometimes such a skillful division is not possible and a side having a required operation time longer than $T_{op}$/2 appears. In this case, there is a disadvantage that the operation period is further increased.

Further, since pipeline registers are inserted with respect to all data at the opening portions formed by the division, there are the problems that the size of the circuit is increased, the hardware overhead is large, and an increase of the power consumption is unavoidable.

SUMMARY OF THE INVENTION

An object of the present invention is to provide a logic cell capable of realizing a high speed logic operation with little hardware overhead and without using a pipeline register and capable of realizing a lowering of the power consumption and a logic circuit using the same.

To attain the above object, according to a first aspect of the present invention, there is provided a logic cell for performing a predetermined logic operation in accordance with a plurality of input signals, comprising a logic tree circuit having a plurality of switching elements connected between an output node and a reference potential, the switching element arranged nearest to the reference potential being controlled by a signal arriving earliest among the plurality of input signals, and the switching element arranged nearest to the out put node being controlled by a signal arriving latest among the plurality of input signals, and an output circuit connected to the output node and outputting the signal of the output node in accordance with the signal arriving latest among the plurality of input signals.

According to a second aspect of the present invention, there is provided a logic circuit comprising an input register for holding a plurality of input signals; a logic operation circuit comprising a plurality of logic cells each receiving a signal held by the input register, performing a predetermined logic operation, and outputting operation results to the next logic cell; an output register for holding and outputting the output signal of a last logic cell; and a reset circuit for resetting the input register when the output signal of a monitor use logic cell selected from among the plurality of logic cells is in a predetermined state in accordance with the output of the monitor use logic cell; the logic cell comprising a logic tree circuit having a plurality of switching elements connected between an output node and a reference potential, the switching element arranged nearest to the reference potential being controlled by a signal arriving earliest among the plurality of input signals, and the switching element arranged nearest to the output node being controlled by a signal arriving latest among the plurality of input signals, and an output circuit connected to the output node and outputting the signal of the output node in accordance with the signal arriving latest among the plurality of input signals.

Preferably the logic tree circuit is formed by Shannon expansion of the plurality of input signals in order from the latest arrival.

Preferably the output circuit has a latch circuit for holding the signal level of the output node.

Preferably the input register converts each input signal to a pair of signals, and each signal pair takes at least three logic states of a logic 0 (0, 1), a logic 1 (1, 0), and a blank (0, 0).

More preferably, when the input signal arriving the latest takes the blank state, the output circuit of each logic cell other than the last logic cell outputs a signal indicating the blank state, and the output circuit of the last logic cell holds and outputs the operation result immediately before that.

More preferably, when the output of the monitor use logic cell takes a state other than the blank state, the reset circuit resets the input register.

Preferably, when the input register is reset, all output signals are held at signals indicating the blank state.

That is, according to the present invention, there is provided a logic circuit for performing a predetermined logic operation in accordance with a plurality of input signals comprising a logic operation circuit configured by a plurality of logic cells connected in series. Each input signal is converted to a two-wire signal, that is, 2 bits of data, and logic codes representing at least three logic states of the logic 0, logic 1, and the blank state are comprised by these two-wire signals. Each logic cell is configured by a logic tree circuit formed by Shannon expansion of the input signals in order of the latest arrival and an output circuit.

In the logic operation circuit comprising the plurality of logic cells, a predetermined logic cell existing in the middle is selected as the monitor use logic cell. When the output of the related monitor use logic cell becomes a code other than the blank code ((0, 1) or (1, 0), below, this will be referred to as a valid logic code), all outputs of the input register are switched to the blank code by the reset circuit. This blank code is propagated to the output side by the logic cells. When the output of the monitor use logic cell becomes the blank code, the reset of the input register is released, whereby the input signal is converted to a two-wire code synchronous to the clock signal and input to each logic cell. Predetermined logic operations are carried out in accordance with these input codes. When the output of the monitor use logic cell becomes a valid logic code, the input register is reset, and a blank code is input to each logic cell again and propagated to the output side.

In the logic circuit configured in this way, a pipeline operation can be realized without providing pipeline registers between the plurality of logic cells, an increase of the circuit scale can be suppressed, the hardware overhead can be avoided, and a raising of speed of the operation, and a reduction of the power consumption can be realized.

BRIEF DESCRIPTION OF THE DRAWINGS

These and other objects and features of the present invention will become clearer from the following description of the preferred embodiments given with reference to the attached drawings, in which:

FIGS. 1A to 1C are block diagrams of examples of the configuration of a conventional pipeline structure logic operation circuit;

FIG. 2 is a circuit diagram of an embodiment of a logic cell configuring a logic circuit according to the present invention;

FIGS. 4A and 4B are a circuit diagram of an example of the configuration of an output circuit used in the logic cell of the present invention and a logic table;

FIGS. 7A and 7B are views for explaining how to form a logic tree circuit of the related art;

DESCRIPTION OF THE PREFERRED EMBODIMENTS

Figure 3A:
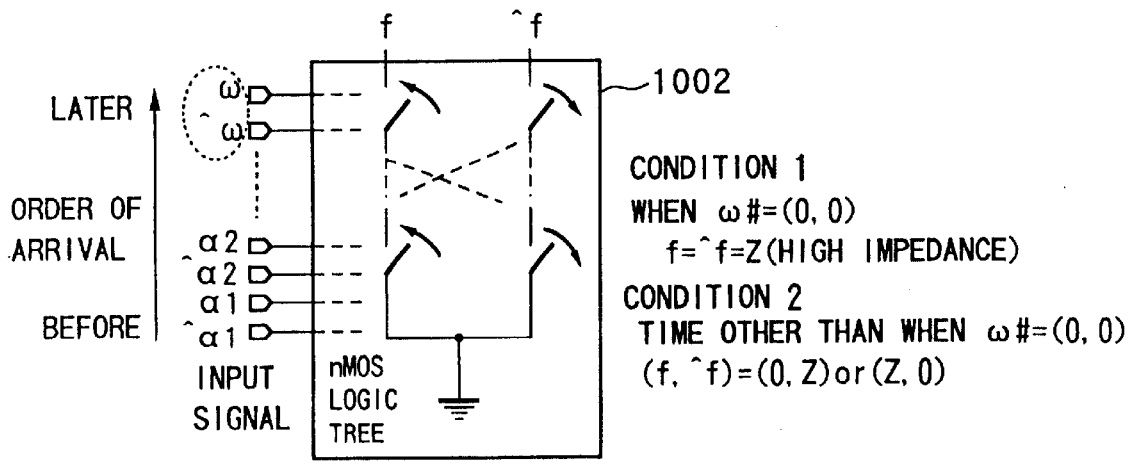
FIGS. 3A to 3C are circuit diagrams of a logic tree circuit used in the logic cell of the present invention.

A logic circuit of the present invention employs a code system referred to as a two-wire two-phase type. In this code system, one bit of a logic code is represented by two paired signal lines. In the following explanation, in this code system, one bit of a code "a" is denoted by a two-wire two-phase type code a#=(a, ˆa). Further, when two signal lines are not differentiated, but are expressed together, they are simply denoted by a#. The potential state of two signal lines is expressed as (a, ˆa)=(0, 1), (0, 1), or (0, 0).

The codes are roughly classified to "valid logic codes" and an "invalid logic code". The valid logic codes include the logic "0" and the logic "1" and are defined as (a, ˆa)=(0, 1), (1, 0). When they are not differentiated, they will be simply indicated as the "logic code" below.

The invalid code is defined by (a, ˆa)=(0, 0). This is a code for differentiating and punctuating logic codes flowing successively in series. This corresponds to a so-called "blank" character, therefore will be simply referred to as a "blank code" below.

In code transmission, a logic code and the blank code alternately appear one by one in series. For this reason, this is referred to as a two-phase type. A symbol of a logic negation originally does not permit a state such as (a=ˆa=0) (contradiction). Here, however, this is not grasped as a logic contradiction, but regarded as a state appearing in the middle of the transmission of a code.

The logic circuit of the present invention has a pipeline structure configured by the logic cells. Further, the logic circuit of the present invention is configured assuming that the order of arrival of the signals input to a certain logic cell is already known. This assumption is important for establishment of the logic circuit of the present invention. Here, only the order of arrival of the signals input to the logic cell has to be already known—not the time difference of the arrival times or quantities such as the maximum value and the minimum value. Further, the most important matter in the order of arrival is that the signal arriving latest is known. The order of arrival is not so important for signals other than that.

In logic design, the concept of the "critical path" indicating the path of propagation of the signal arriving latest has been generally considered in the related art. Further, the relationship of the order of arrival can be estimated from the number of logic cells in the actual logic structure, the length of interconnections, etc. and does not vary much with respect to a change in temperature or the like. Accordingly, this assumption is not unrealistic in the actual design of a logic circuit.

Configuration of Logic Circuit

FIG. 2 is a circuit diagram of the general configuration of a logic cell comprising part of a logic circuit of the present invention. As illustrated, a logic cell 100 is configured by an output circuit 110 provided with a precharge circuit and an output buffer etc. and by a logic tree circuit 120 configured by nMOS transistors.

Here, the order of arrival of the input signals input to a logic cell is defined as a1#, a2#, . . . , ω# from the earliest arrival. Among them, the signal arriving latest is ω#. In the logic tree circuit 120 configured by the nMOS transistors, the circuit is configured so that the earlier the order of arrival of the signal, the nearer the position to the reference potential (ground) the nMOS transistor connected thereto is arranged. The nMOS transistor connected to the signal ω# arriving the latest is arranged in the uppermost portion of the logic tree circuit 120 (position nearest the output circuit 110). Further, the signal ω# is supplied to also the output circuit 110 and has a function of switching the operation of the output circuit 110.

Figure 3B:
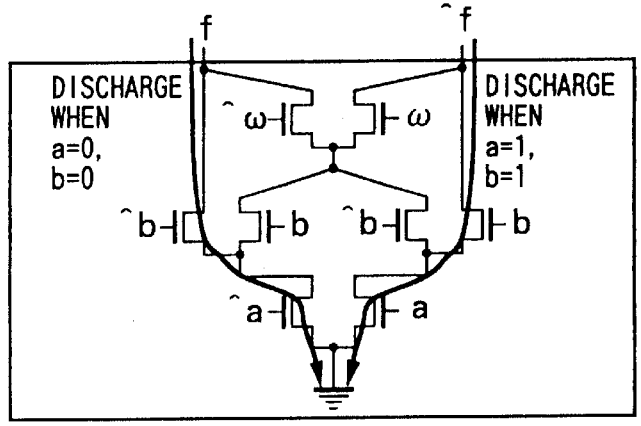
Figure 3C:
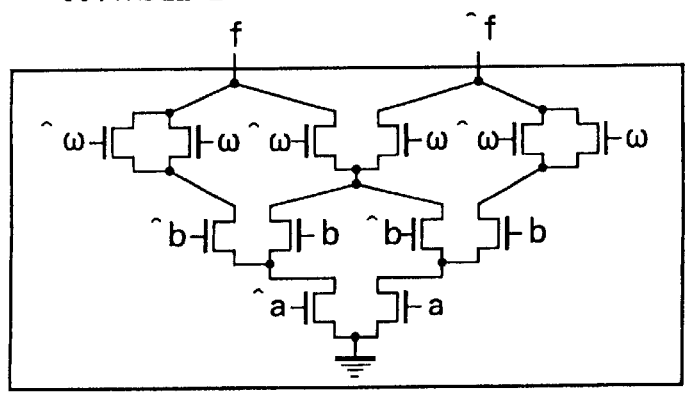
Figures 5A, 5B:
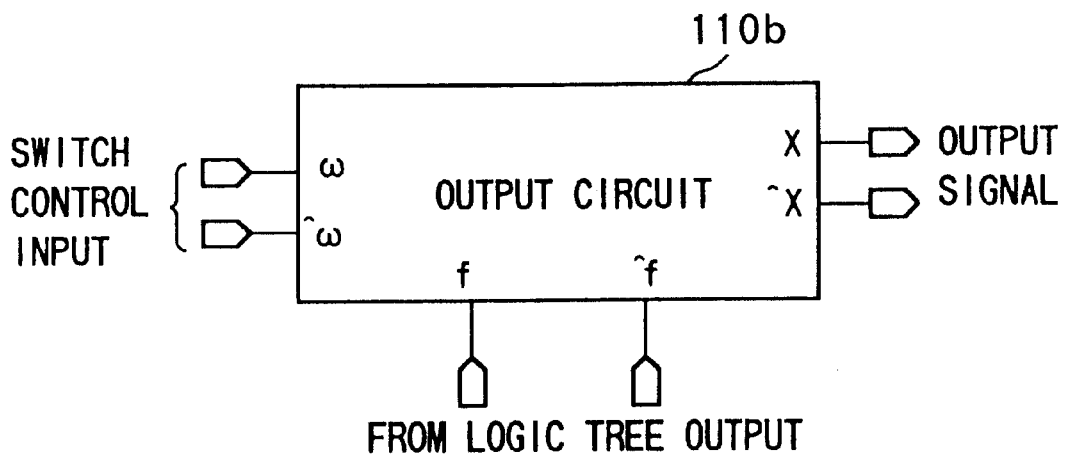
FIGS. 5A and 5B are a circuit diagram of an example of another configuration of the output circuit used in the logic cell of the present invention and a logic table.

FIGS. 3A to 3C are circuit diagrams showing the concept of the logic tree circuit used in the present invention. The important matter here is that there is never a path reaching the ground when the signal ω# is the blank code. In the case of the logic tree shown in FIG. 3B, when a=b=1 or a=b=0, a path to the ground is formed irrespective of the state of ω#. Such a logic tree structure is not permitted in the present invention. When such a logic path exists, two nMOS transistors are provided on that path to reconfigure the structure to the logic tree as in FIG. 3C.

FIGS. 4A and 4B and FIGS. 5A and 5B show two examples of the output circuit used in the logic cell of the present invention. Here, signals ω and ^ω input to the output circuit 110 are signals having the latest order of arrival among a plurality of signals α1, ^α1, α2, ^α2, . . . , ω), ^ω input to the logic tree circuit 120. In an output circuit 110a shown in FIG. 4A, when the signal ω# changes from a logic code to the blank code, an output (X, ^X) changes to the blank code (0, 0). Contrary to this, in an output circuit 110b shown in FIG. 5A, when the signal ω# changes from a logic code to the blank code, the output (X, ^X) maintains the state immediately before that. Below, when these are not differentiated, they will be simply referred to as the "output circuit". When the former is indicated, it will be referred to as a "nonlatch type output circuit", while when the latter is indicated, it will be referred to as a "latch type output circuit".

Method for Forming Logic Tree

As mentioned above, in the logic tree circuit 120 comprising part of the logic cell 100 of the present invention, when the latest input signal ω# is the blank code, a path from the output circuit to the ground must not be formed. For this reason, in the present invention, it is necessary to configure the logic tree circuit 120 to satisfy this condition. Below, an explanation will be made of the method for forming the logic tree circuit 120 in the present invention.

FIGS. 6A and 6B and FIGS. 7A and 7B are circuit diagrams for explaining the method of forming a logic tree circuit of the related art. Here, a method of forming an nMOS transistor logic tree used in a conventional differential cascade voltage switch logic (DCVS) method or a cascade voltage switch logic (CVSL) method etc. is shown. These methods of configuration of a logic tree circuit have been disclosed in the IEEE Journal of Solid-state Circuits, vol. sc-21, no. 6, pp. 1082–1087, December 1986, etc.

Here, as an example, a method of forming a logic tree circuit for finding a logic function such as f=a+b+c is shown.

Figure 6B:
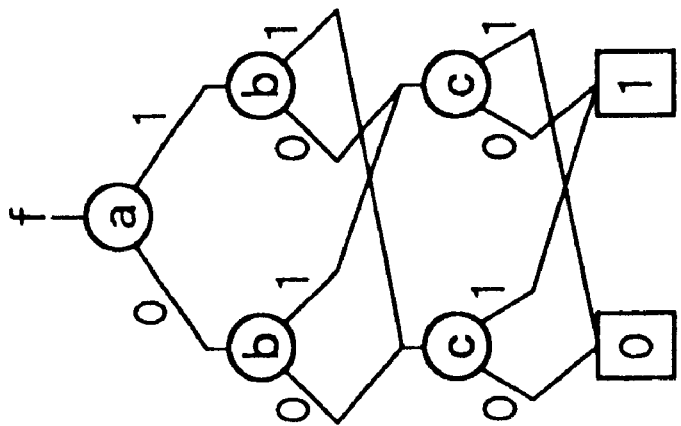
FIGS. 6A and 6B are views for explaining how to form a logic tree circuit of the related art.
Figure 6A:
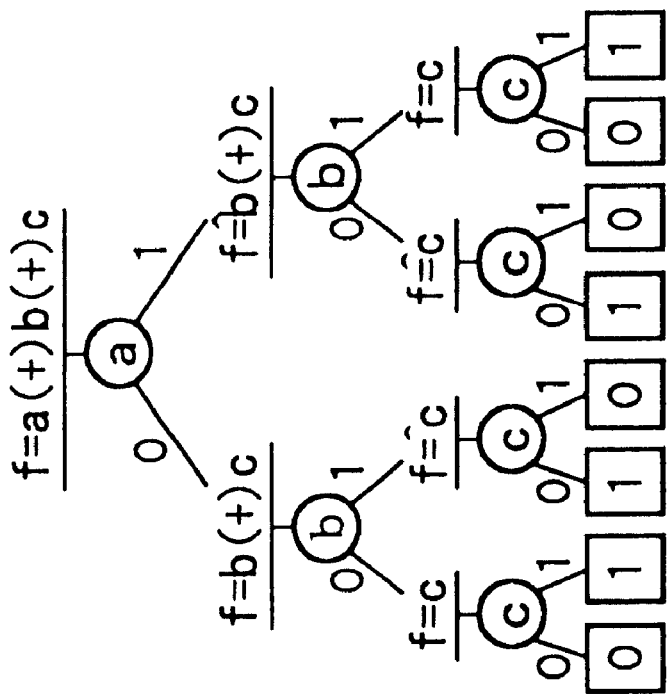
Figure 8C:
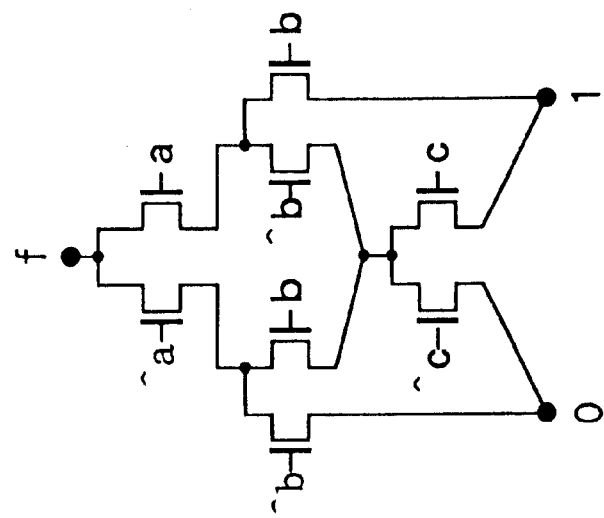
FIGS. 8A to 8C show an unsuitable logic circuit formed by a method of the related art.
Figure 8B:
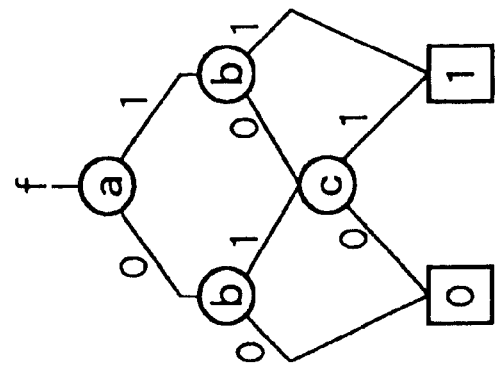
Figure 8A:
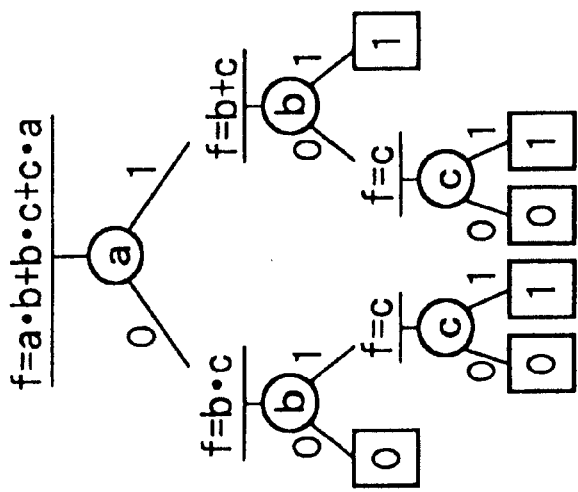

First, as shown in FIG. 6A, binary tree expansion is performed on f. Note that the method used here will be also referred to as BDD expansion or Shannon expansion. The order of the variables at this time may be any order in the case of DCVS. When the order of arrival is known in advance, however, a logic tree expanded in the order from the earliest arrival has better electrical characteristics.

The portions which can be shared in the obtained binary tree are shared to form a reduced binary tree (FIG. 6B). When replacing one variable node by a selector comprising two nMOS transistors, the logic tree circuit shown in FIG. 7A is obtained.

Further, when connecting the root of the logic tree circuit (end point f of FIG. 7A) to the ground (grounding) and defining a 0 end point of the logic tree as an output node f and a 1 end point of the logic tree as a negative logic output node ^f, the logic tree circuit of FIG. 7B is obtained.

Figure 9B:
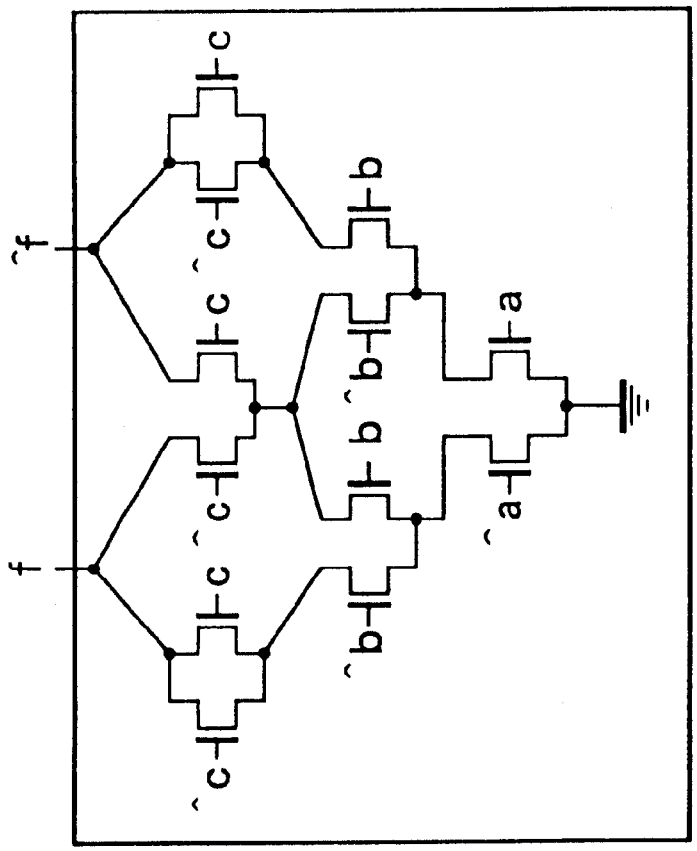
FIGS. 9A and 9B show an unsuitable logic circuit formed by the method of the related art.
Figure 9A:
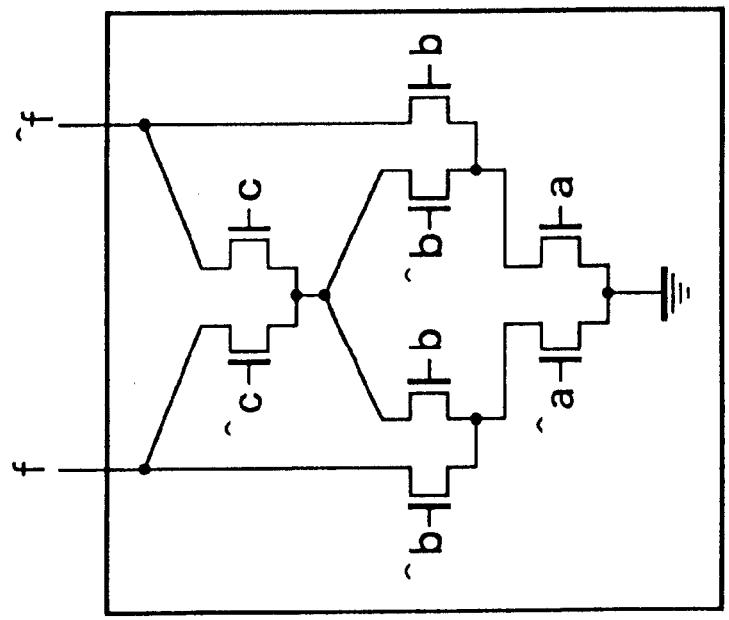

In the method of the related art of forming the logic tree, there is a case where a logic tree unsuitable for the present invention is formed. An example of this is shown in FIGS. 8A to 8C and FIGS. 9A and 9B. In this example, a logic tree for finding a logic function such as f=a·b+b·c+c·d is expanded. FIGS. 8A to 8C and FIG. 9A show steps of expanding a logic tree by the method of the related art. The logic tree shown in FIG. 9A may have a discharge path formed from the output nodes f and ^f to the ground without depending upon a signal c#, so is a logic tree unsuitable for the present invention. Accordingly, in order to block the discharge path, it is necessary to add extra nMOS transistors as shown in FIG. 9B.

In this way, in the conventional procedure of expansion of a logic tree, there are cases where the number of the nMOS transistors connected to the signal arriving the latest becomes large and the load becomes large. This becomes a cause lowering the logic operation speed of the logic circuit, so usually must be avoided.

Next, an explanation will be made of the procedure for deriving a logic tree suitable for the logic circuit of the present invention. FIGS. 10A to 10C and FIGS. 11A to 11D show an example of the expansion of a logic tree of the present invention. Here, the procedure of expansion of a logic tree for finding the logic function f=a+b+c similar to that described above is shown.

Figures 10A, 10B, 10C:
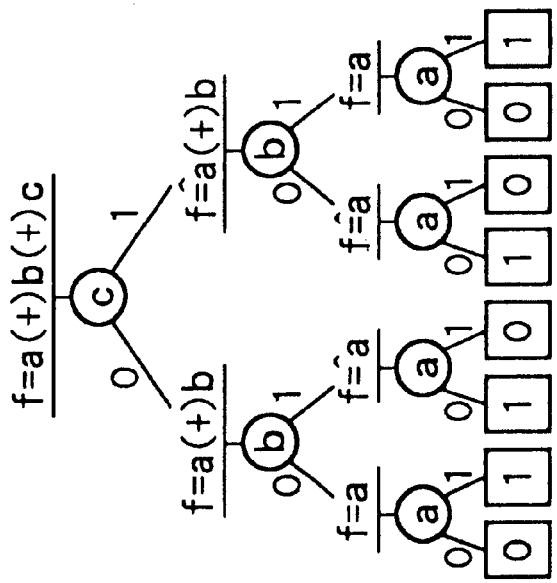
FIGS. 10A to 10C are views of the procedure for derivation of a logic tree circuit suitable for the logic circuit of the present invention.

First, as shown in FIG. 10A, the binary tree is expanded in order from the latest arrival of a signal. Then, the reduced binary tree is found as shown in FIG. 10B.

Figure 11A:
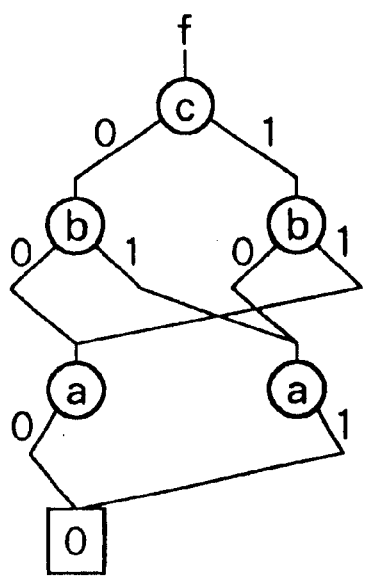
FIGS. 11A to 11D are views of the procedure for derivation of a logic tree circuit suitable for the logic circuit of the present invention.

Next, the logic 0 end point of FIG. 10B is replaced by the 1 end point and the logic 1 end point is replaced by the 0 end point to form the logic tree circuit of ^f shown in FIG. 10C. Further, as shown in FIG. 11A, the logic end point 1 is removed from the logic tree circuit of f. Similarly, as shown in FIG. 11B, the logic end point 1 is removed from the logic tree circuit of ^f.

Figure 11B:
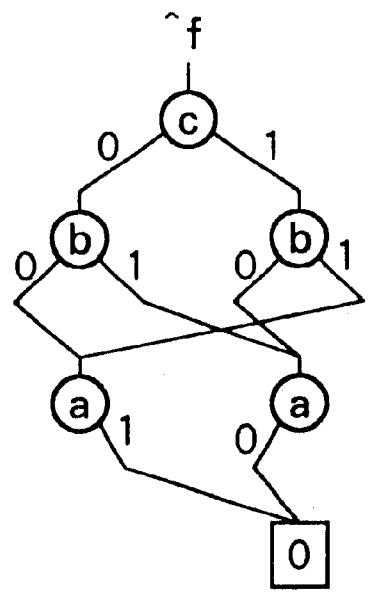

In the logic tree circuit of ^f, the 0 and 1 are switched in FIG. 10C, so the results of FIGS. 11A and 11B are naturally different.

Figure 11C:
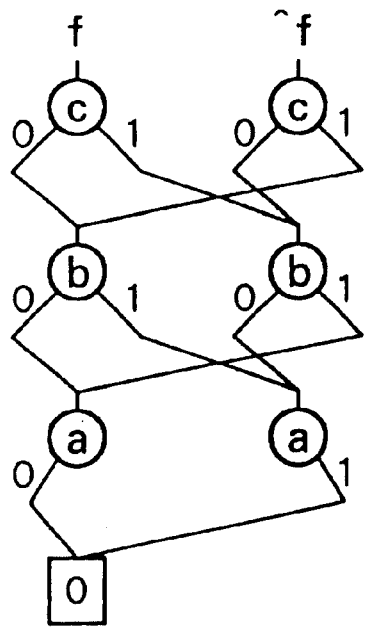
Figure 11D:
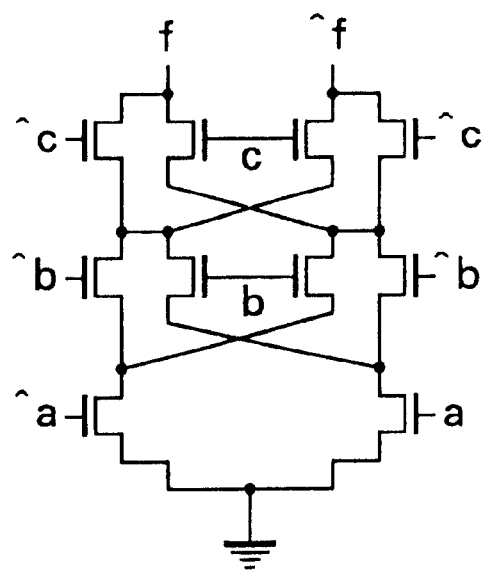
Figure 12C:
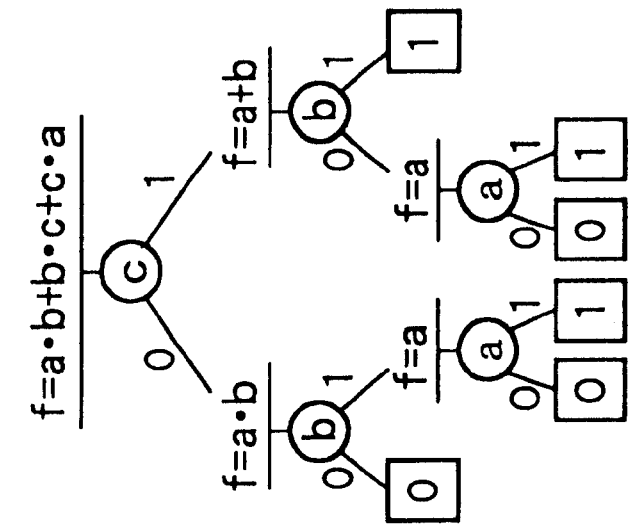
FIGS. 12A to 12C are views of the process of forming a logic tree circuit for other logic functions.
Figure 12B:
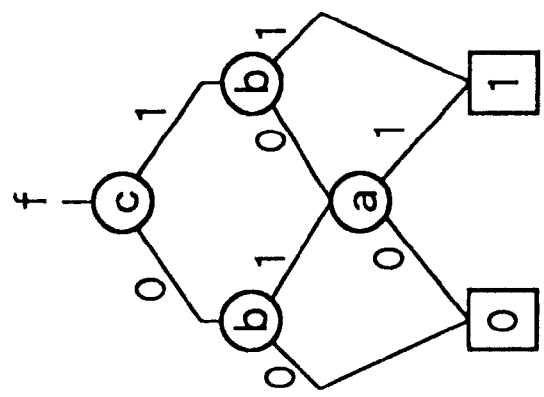
Figure 12A:
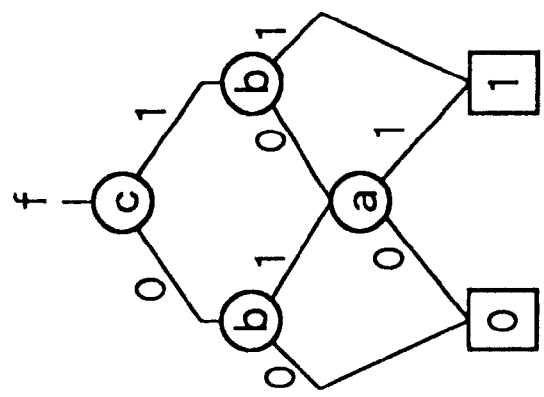

The structures which can be shared are found viewed from the logic end points in FIGS. 11A and 11B and are shared. As a result, the logic tree circuit having the structure shown in FIG. 11C is obtained. Then, each variable node having two branches is replaced by a selector comprised of two nMOS transistors, and each variable node having one branch is replaced by a switch of one NMOS transistor. Further, the logic end point 0 is grounded. If the point f and the point ^f of the roots of the logic tree circuit are defined as the output nodes of the logic tree circuit as they are, as shown in FIG. 11D, a logic tree circuit suitable for the logic circuit of the present invention is obtained.

The important point in the procedure for formation of the logic tree circuit mentioned above is that the expansion be carried out at first for the signal arriving the latest. When expanding the tree in this way, when reducing the binary tree, the node of the signal arriving the latest is not erased. Then, any discharge path reaching the ground will always pass through the switch for the signal arriving the latest.

In the same way as the procedure explained above, the process for forming a logic tree circuit for the logic function (f=a·b+b·c+c·a) is shown in FIGS. 12A to 12C and FIGS. 13A to 13D.

Figure 13A:
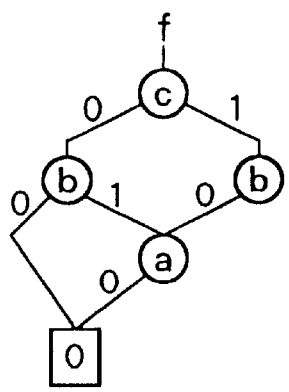
FIGS. 13A to 13D are views of the process of forming a logic tree circuit for other logic functions.
Figure 13B:
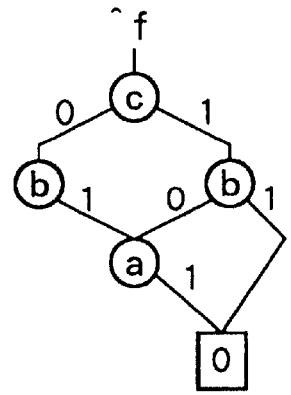
Figure 13C:
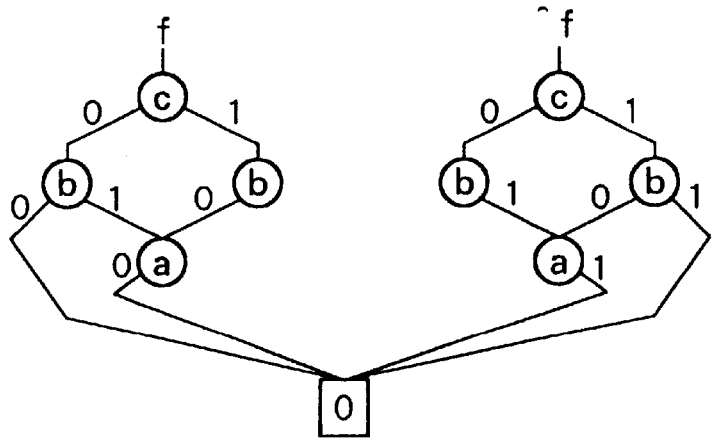
Figure 13D:
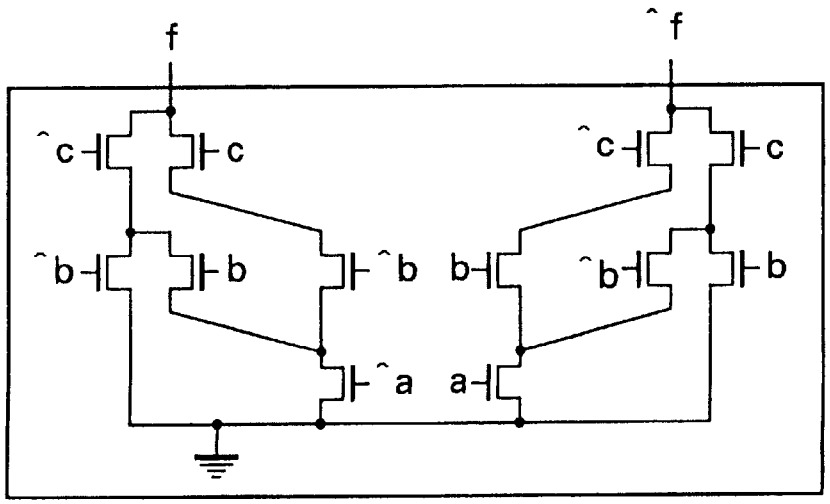

In the case of this logic function, as mentioned above, extra NMOS transistors become necessary in the method of the related art. Six nMOS transistors become the load for the latest signal c#. According to the procedure for formation of the present invention, as shown in FIG. 13D, the number of the transistors which become the load for the signal c# is four. In comparison with the method of the related art, the number of the transistors for the latest signal is decreased, and an effect of reducing the load of the signal is obtained.

Embodiment of Output Circuit

As shown in FIG. 2, the logic cell 100 comprising part of the logic circuit of the present invention is configured by the output circuit 110 and the logic tree circuit 120. The specifications of the nonlatch type and latch type output circuits are shown in FIGS. 4A and 4B and FIGS. 5A and 5B.

Next, an explanation will be made of the concrete circuit configuration for the nonlatch type and the latch type output circuits.

Figure 14A:
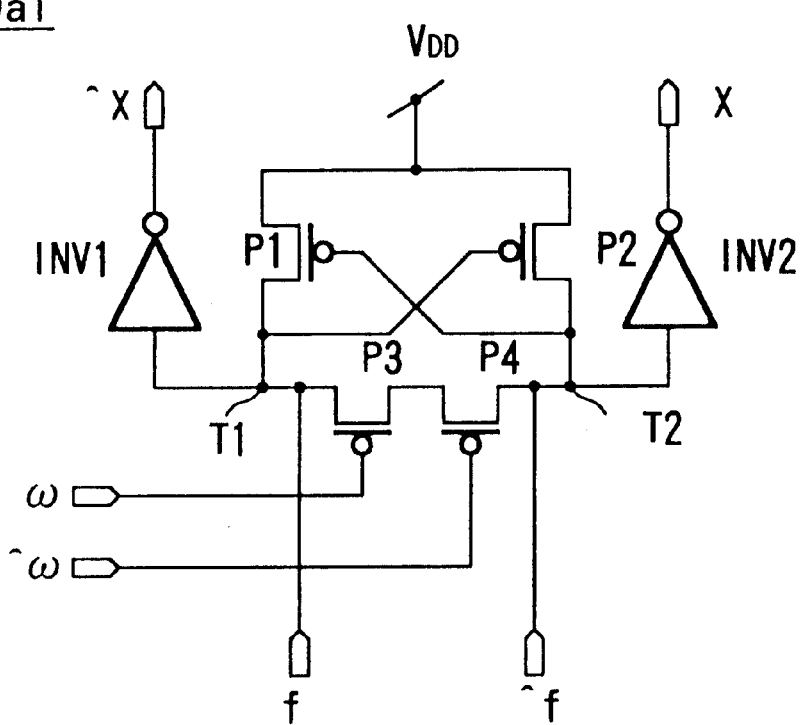
FIGS. 14A and 14B are circuit diagrams of the configurations of nonlatch type output circuits.

FIGS. 14A and 14B and FIGS. 15A and 15B are circuit diagrams showing examples of the configuration of a non-latch type output circuit. As shown in FIG. 14A, a nonlatch type output circuit 110a1 is configured by pMOS transistors P1, P2, P3, and P4 and inverters INV1 and INV2. The transistors P1 and P2 are connected between a supply line of a power supply voltage $V_{DD}$ and internal terminals T1 and T2. A gate of the transistor P1 is connected to a drain of the transistor P2, and the gate of the transistor P2 is connected to the drain of the transistor P1. The transistors P3 and P4 are connected in series between the internal terminals T1 and T2, and signals ω and ^ω are supplied to the gates of the transistors P3 and P4, respectively. The input terminals of the inverters INV1 and INV2 are connected to the internal terminals T1 and T2, respectively. Further, the internal terminals T1 and T2 are connected to the terminals f and ^f of the logic tree circuit.

Figure 14B:
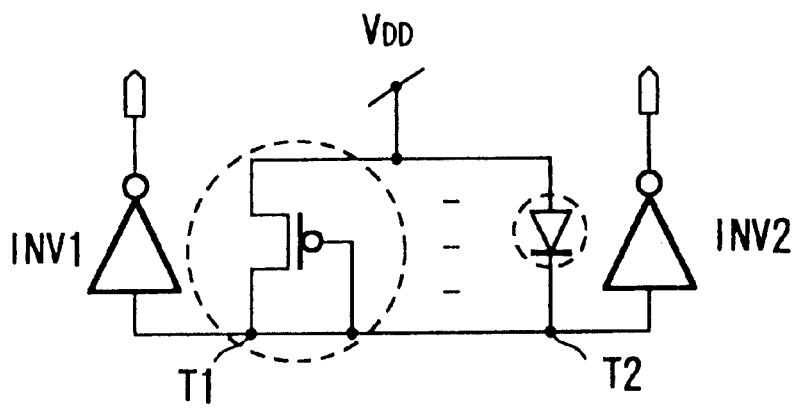

In the nonlatch type output circuit 110a1 configured in this way, when the signal (ω, ^ω)=(0, 0), that is, ω#, is the blank code, both of the transistors P3 and P4 become conductive. FIG. 14B shows an equivalent circuit of the output circuit 110a1 in this case. As illustrated, the transistors P1 and P2 exhibit a diode connection, the internal terminals T1 and T2 are charged by the power supply voltage $V_{DD}$ and become the high level, and therefore both of the output terminals of the inverters INV1 and tNV2 become the low level. Namely, at this time, the output of the output circuit is the blank code, that is (X, ^X)=(0, 0)

When ω# is a code other than the blank code, either of the signals ω and ^ω becomes the high level, and a discharge path to the ground is formed in either of the internal terminals T1 and T2 in accordance with the input signal input to the logic tree circuit and is held at the ground potential. The potentials of the terminals T1 and T2 are latched by the latch circuit configured by the transistors P1 and P2. Namely, when the input signal ω# is the blank code (0, 0), the internal terminals T1 and T2 are precharged by the power supply voltage $V_{DD}$, while when the input signal ω# changes to a logic code other than the blank code (0, 0), in the output circuit 110a1, the level of the output signal (X, ^X) is held in accordance with the input signal.

Figure 15A:
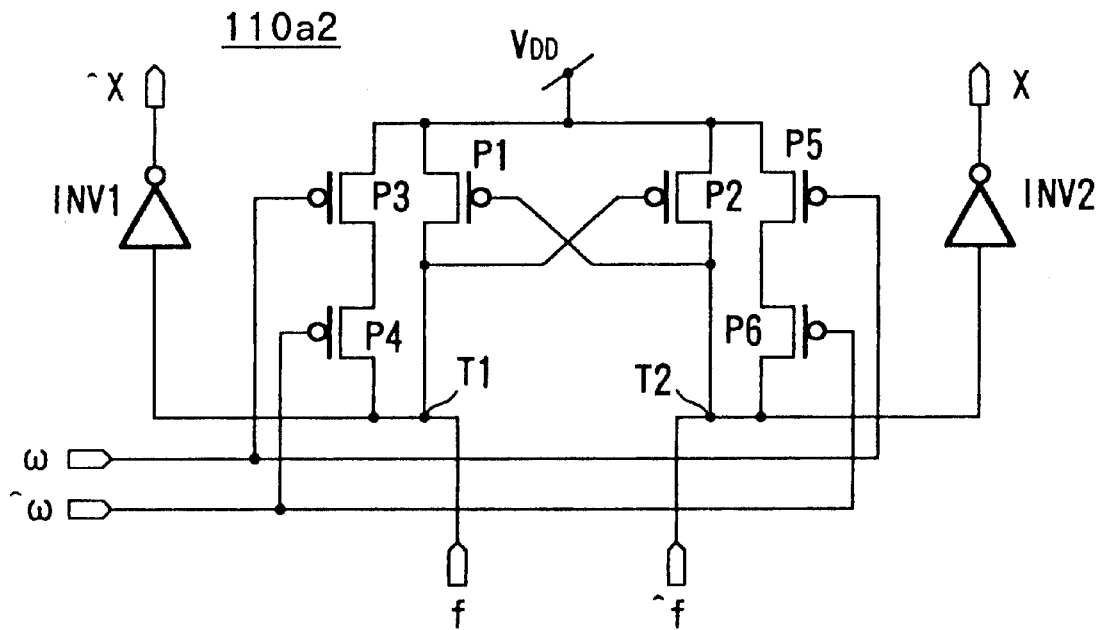
FIGS. 15A and 15B are circuit diagrams of other examples of nonlatch type output circuits.
Figure 15B:
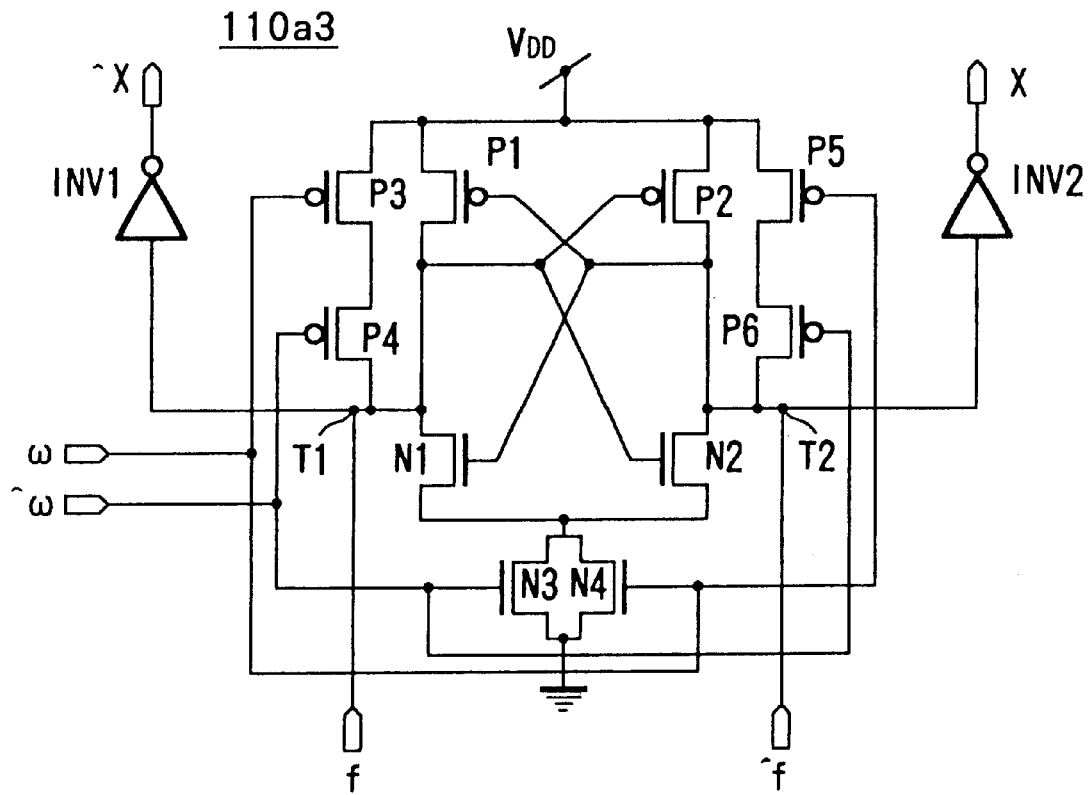

FIGS. 15A and 15B are circuit diagrams showing other concrete examples of the nonlatch type output circuit. FIG. 15A is a circuit diagram showing the configuration of an output circuit 110a2. As illustrated, the output circuit 110a2 is configured by the pMOS transistors P1 and P2 configuring the latch circuit and further by the pMOS transistors P3 to P6 and inverters INV1 and INV2.

As illustrated, the transistors P3 and P4 are connected in series between the supply line of the power supply voltage $V_{DD}$ and the internal terminal T1 and have gates supplied with the signals ω and ^ω. The transistors P5 and P6 are connected in series between the supply line of the power supply voltage $V_{DD}$ and the internal terminal T2 and have gates supplied with the signals ω and ^ω.

When the signal ω#=(0, 0), that is, when the signal ω# is the blank code, all of the transistors P3 to P6 become conductive, and the internal terminals T1 and T2 are charged by the power supply voltage $V_{DD}$ and are held at the high level. At this time, the output signal (X, ^X) becomes equal to (0, 0). When the signal ω# is a code other than the blank code, the levels of the internal terminals T1 and T2 are set in accordance with the signal input to the logic tree circuit and latched by the latch circuit comprising the transistors P1 and P2.

A nonlatch type output circuit 110a3 shown in FIG. 15B is obtained by further adding nMOS transistors N1, N2, N3, and N4 to the output circuit 110a2 shown in FIG. 15A. The transistors P1 and N1 and P2 and N2 configure CMOS inverters. The inputs and outputs of these inverters are connected to each other, whereby a latch circuit is configured.

The nonlatch type output circuit 110a3 operates in almost the same way as the nonlatch type output circuit 110a2.

Figure 16A:
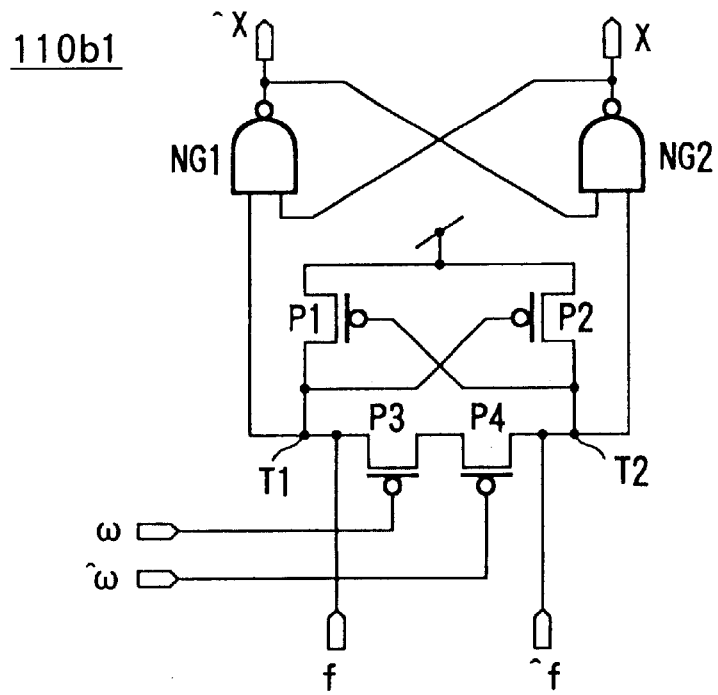
FIGS. 16A and 16B are circuit diagrams of the configurations of latch type output circuits.
Figure 16B:
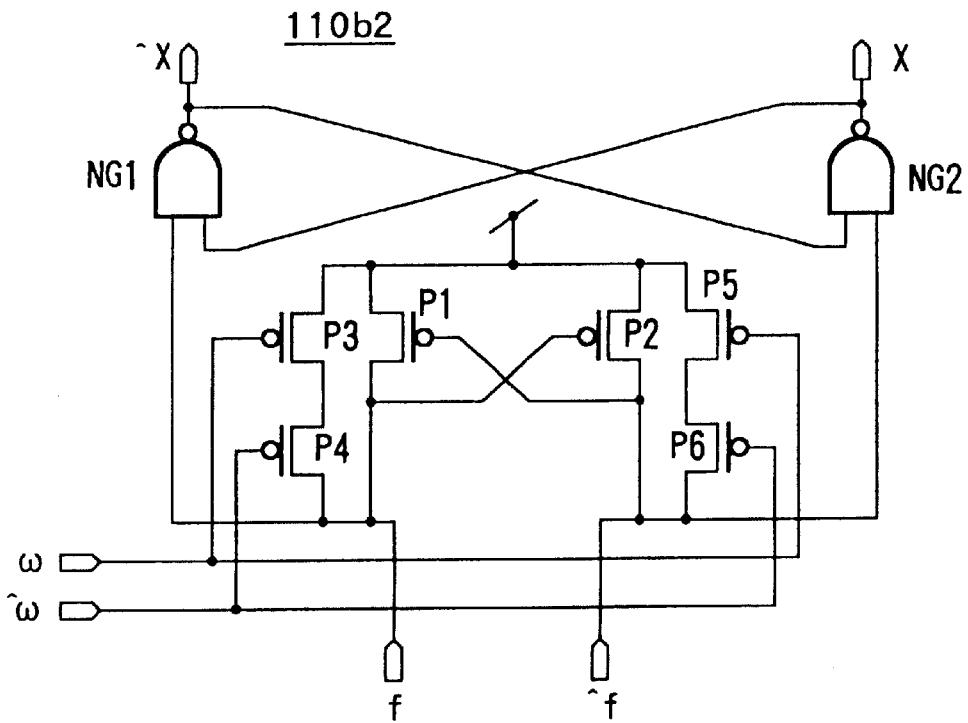
Figure 17:
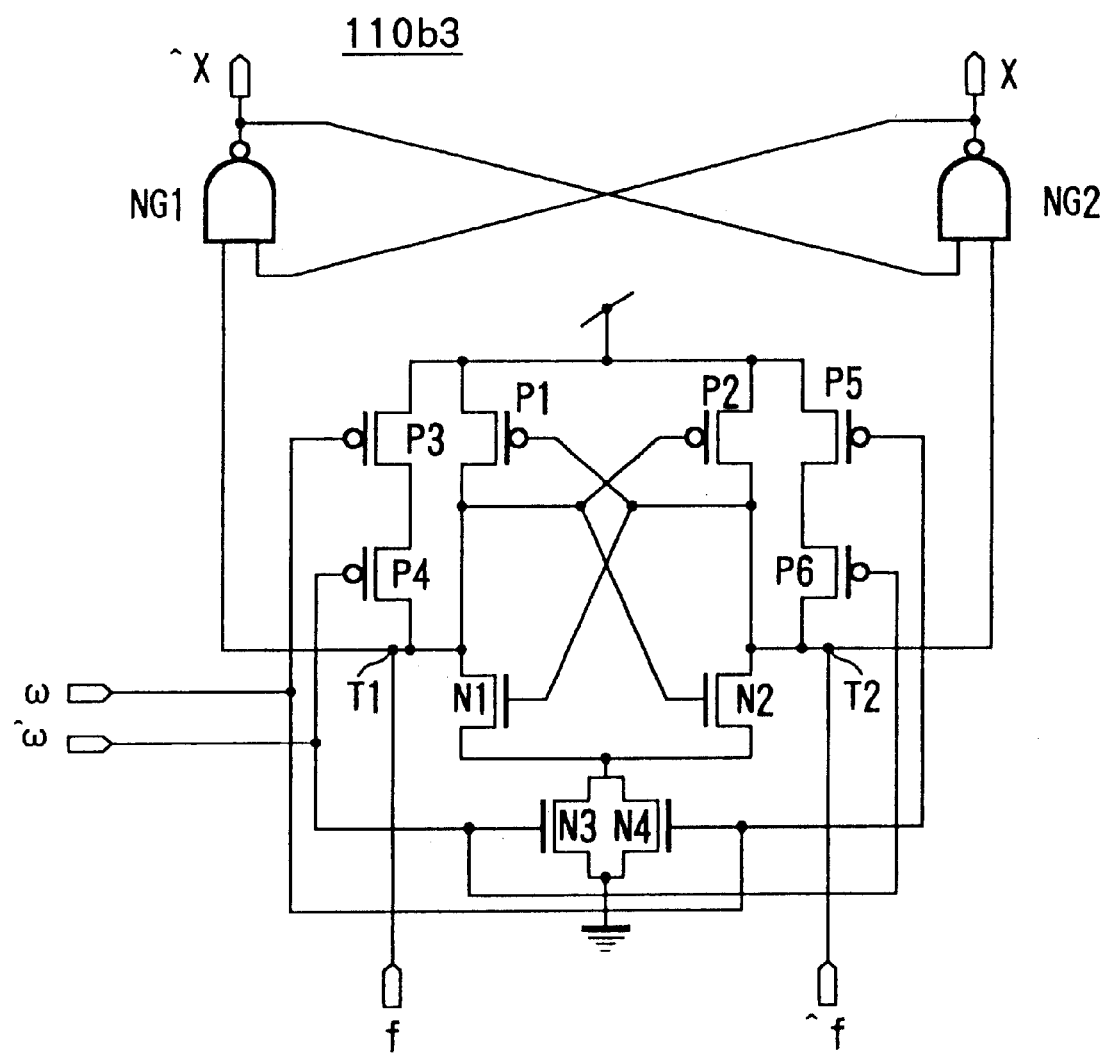
FIG. 17 is a circuit diagram of another example of a latch type output circuit.

FIGS. 16A and 16B and FIG. 17 are circuit diagrams showing examples of the configuration of a latch type output circuit. FIGS. 16A and 16B show the circuit configurations of the latch type output circuits 110b1 and 110b2, and FIG. 17 shows the circuit configuration of a latch type output circuit 110b3. As shown in FIGS. 16A and 16B and FIG. 17, these latch type output circuits replace the inverters INV1 and INV2 of the nonlatch type output circuits shown in FIGS. 14A and 14B and FIGS. 15A and 15B by an RS flip-flop comprising NAND gates NG1 and NG2.

Below, an explanation will be made of the configuration and operation of the latch type output circuit 110b1 by referring to FIG. 16A. The latch type output circuit 110b1 is configured by the pMOS transistors P1, P2, P3, and P4 and the NAND gates NG1 and NG2. The connection of the transistors P1 to P4 is substantially the same as that of the nonlatch type output circuit 110a1 shown in FIG. 14A. The NAND gates NG1 and NG2 configure the RS flip-flop. Namely, one input terminal of the NAND gate NG1 is connected to the internal terminal T1, and the other input terminal is connected to the output terminal of the NAND gate NG2, while one input terminal of the NAND gate NG2 is connected to the internal terminal T2, and the other input terminal is connected to the output terminal of the NAND gate NG1.

The latch circuit is configured by the RS flip-flop comprising the NAND gates NG1 and NG2. When the input signal ω# is the blank code (0, 0), both of the internal terminals T1 and T2 are held at the high level, therefore the RS flip-flop becomes the held mode and the output signals (X, ˆX) of the NOR gates NR1 and NR2 are held in states immediately before that.

The latch type output circuits 110b2 and 110b3 shown in FIG. 16B and FIG. 17 perform substantially the same operation as that of the latch type output circuit 110b1 shown in FIG. 16A. When the input signal is the blank code (0, 0), the output signal immediately before that is held by the latch circuit comprising the NAND gates NG1 and NG2.

Latch Circuit, Flip-flop Circuit

Next, an explanation will be given of the configurations and operations of the input use latch circuit for inputting the operation data to a logic cell and the flip-flop circuit in the present invention.

As mentioned above, input registers are connected to the front of the logic circuit. These input registers convert the input data D to the two-wire two-phase type code and input the same to the logic cells configuring the logic circuit.

Figures 18A, 18B:
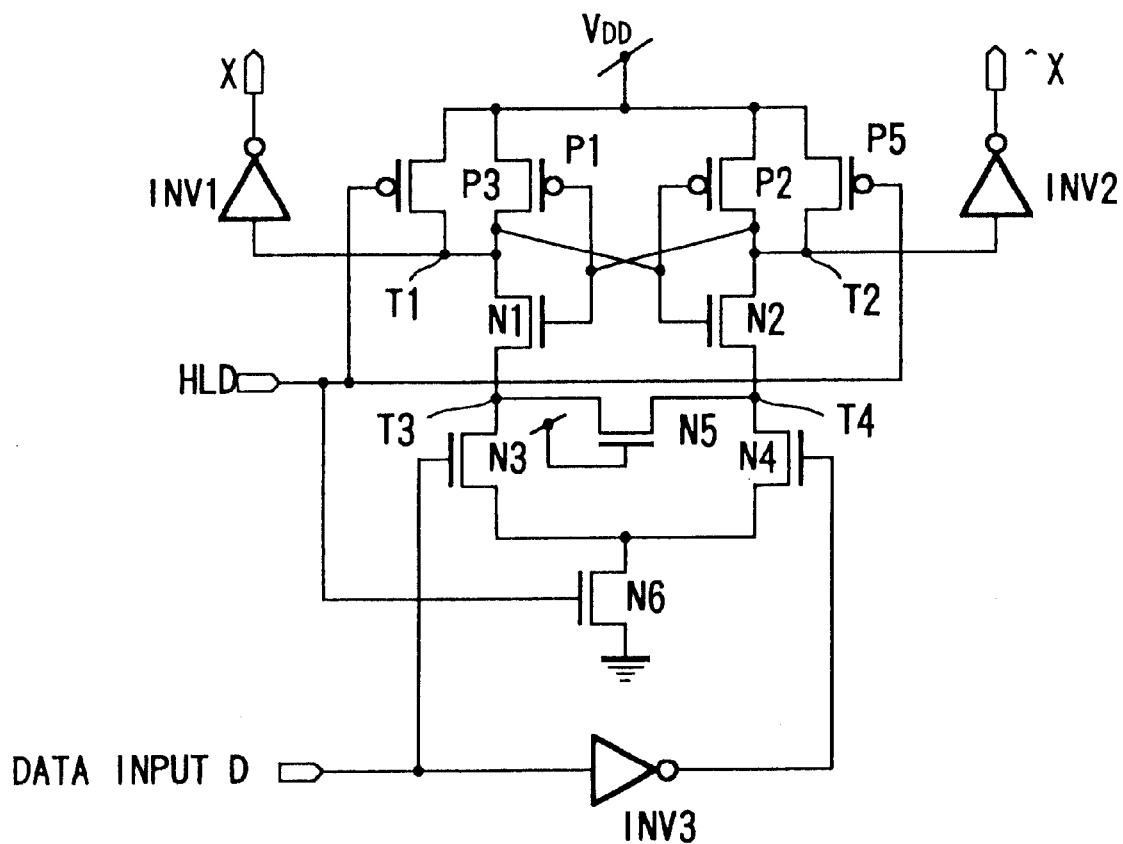
FIGS. 18A and 18B are views of an example of the configuration of an input register use latch circuit and an operation thereof.

FIG. 18A shows an example of the configuration of the input register use latch circuit while FIG. 18B shows the operation of the related latch circuit.

As illustrated, the latch circuit is configured by inverters INV1, INV2, INV3, pMOS transistors P1 to P4, and nMOS transistors N1 to N6.

The transistors P1, N1 and P2, N2 form the CMOS inverters, the inputs and the outputs of these inverters are connected to each other, and thus the latch circuit is configured. The input terminal of the inverter INV1 is connected to a connection point (node) T1 of drains of the transistors P1 and N1, and the input terminal of the inverter INV2 is connected to a connection point T2 of drains of the transistors P2 and N2.

The transistors P3 and P4 are connected between the supply line of the power supply voltage $V_{DD}$ and the nodes T1 and T2 and have gates supplied with hold signals HLD.

The source of the transistor N1 and the drain of the transistor N3 are connected to a node T3, while the source of the transistor N2 and the drain of the transistor N4 are connected to a node T4. A signal in accordance with the data D is input to the gate of the transistor N4, and a logic inverted signal thereof is input to the gate of the transistor N4.

The transistor N5 is connected between the nodes T3 and T4 and has a gate connected to the supply line of the power supply voltage $V_{DD}$.

The sources of the transistors N3 and N4 are commonly connected to the drain of the transistor N6, the source of the transistor N6 is grounded, and the hold signal HLD is supplied to the gate.

FIG. 18B shows the operation of the latch circuit shown in FIG. 18A. When the hold signal HLD is 0, the transistors P3 and P4 become conductive in the latch circuit, and the nodes T1 and T2 are charged to the power supply voltage $V_{DD}$ irrespective of the value of the input data D and held at the high level, therefore the output signal (X, ˆX) of the latch circuit becomes equal to (0, 0). Namely, when the hold signal HLD is 0, the blank code is output from the latch circuit.

Next, when the hold signal HLD changes from 0 to 1, in accordance with the input data D, the output signal (X, ˆX) is set. When the hold signal HLD is 1, the transistors P3 and P4 become nonconductive in the latch circuit, and the transistor N6 becomes conductive. In accordance with the input data D, one of the transistors N3 and N4 becomes conductive and the other becomes nonconductive. For example, where the input data D=1, the transistor N3 becomes conductive, and the transistor N4 becomes nonconductive. A discharge path is formed from the node T1 via the transistors N1, N3 and N6, therefore the potential thereof is lowered to the low level, and the node T1 is held at low level and the node T2 is held at high level by the latch circuit comprising the transistors P1 and P2 and N1 and N2. In accordance with this, the output signal (X, ˆX) is held equal to (1, 0).

Conversely, when the input data D=0, when the hold signal HLD changes from 0 to 1, the output signal (X, ˆX)=(0, 1) is held.

Next, when the hold signal HLD is 1, the transistor N6 is held in the conductive state as it is, therefore the states of the nodes T1 and T2 are held by the latch circuit comprising the transistors P1, P2 and N1, N2. Namely, the signal X# when the hold signal HLD switches from 0 to 1 is held.

Figures 19A, 19B:
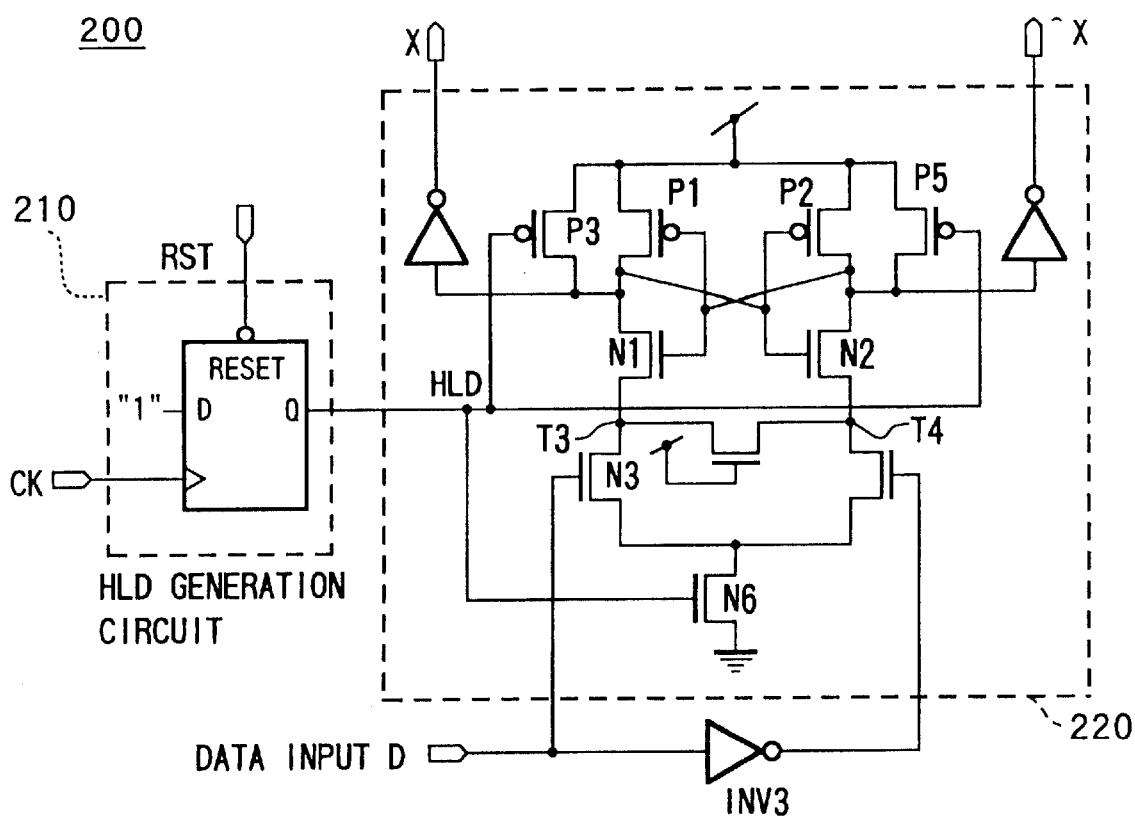
FIGS. 19A and 19B are views of an example of an input register use flip-flop.

An example of the input register use flip-flop is shown in FIGS. 19A and 19B. As shown in FIG. 19A, this flip-flop 200 is configured by a hold signal generation circuit 210 and a latch circuit 220. The latch circuit 220 is configured by the latch circuit shown in FIG. 18A. The hold signal generation circuit 210 is configured by a D flip-flop, generates the hold signal HLD at a timing of a clock signal CK in accordance with the input reset signal RST, and supplies the same to the latch circuit 220.

FIG. 19B shows the logic values of the reset signal RST, clock signal CK, and the hold signal HLD generated by the hold signal generation circuit 210. When the reset signal RST is 0, irrespective of the clock signal CK, the hold signal HLD is held at 0. When the reset signal is 1, at the rising edge of the clock signal CK, the hold signal HLD switches from 0 to 1. In a case other than that, the hold signal HLD is held as it is.

Figure 20:
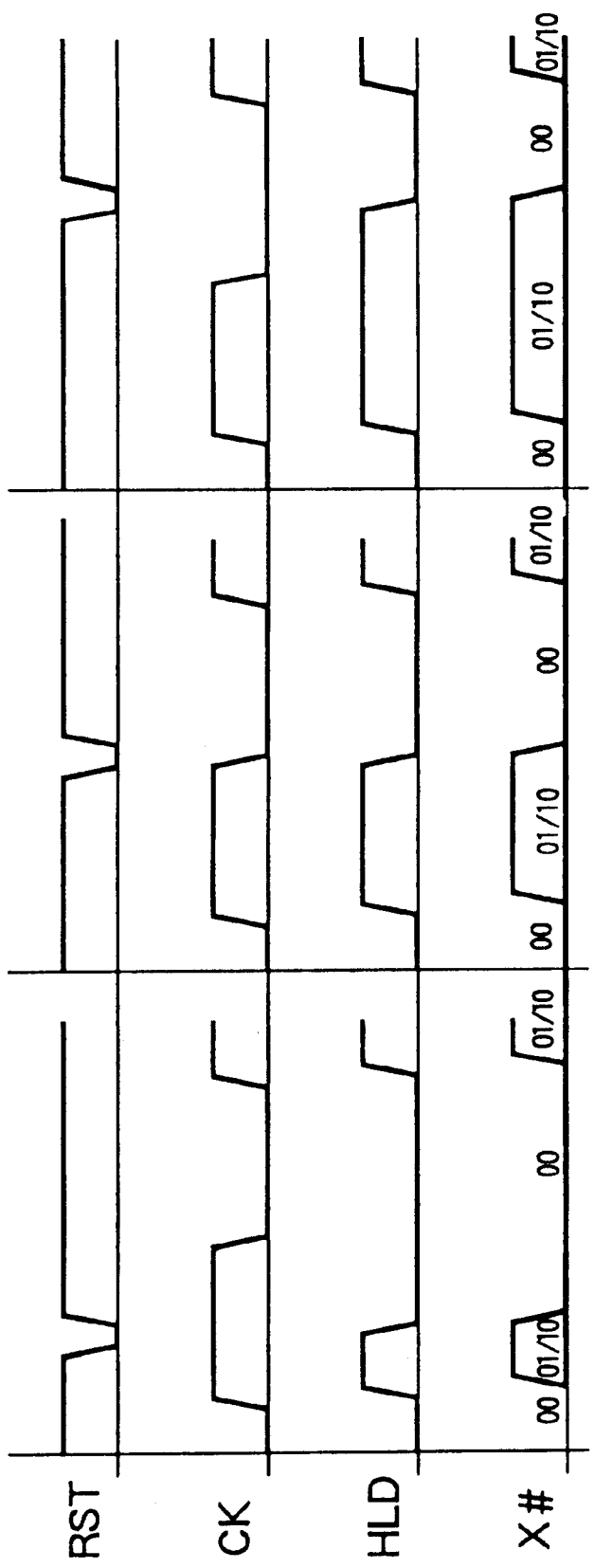
FIG. 20 is a waveform diagram showing the operation of the input register use flip-flop.

FIG. 20 is a waveform diagram showing the operation of the flip-flop shown in FIG. 19A. As illustrated, when the reset signal RST changes from 1 to 0, that is in accordance with a trailing edge of the reset signal RST, the hold signal HLD switches to 0, and the output signal (X, ˆX) becomes the blank code (0, 0).

Next, when the reset signal RTS is 1, the hold signal HLD switches from 0 to 1 at the rising edge of the clock signal CK. In accordance with this, in the latch circuit 220, the output signal (X, ˆX) is held at either of (0, 1) or (1, 0) in accordance with the input data D.

By the input register use flip-flop 200, the synchronous type input data D of single phase is converted to the data of the two-wire and two-phase type which can be supplied to the logic circuit of the present invention synchronous to the clock signal CK.

Principle of Operation of Logic Circuit of Present Invention

Below, an explanation will be made of the principle of operation of the logic circuit of the present invention by referring to FIG. 21 and FIG. 22.

Figure 21:
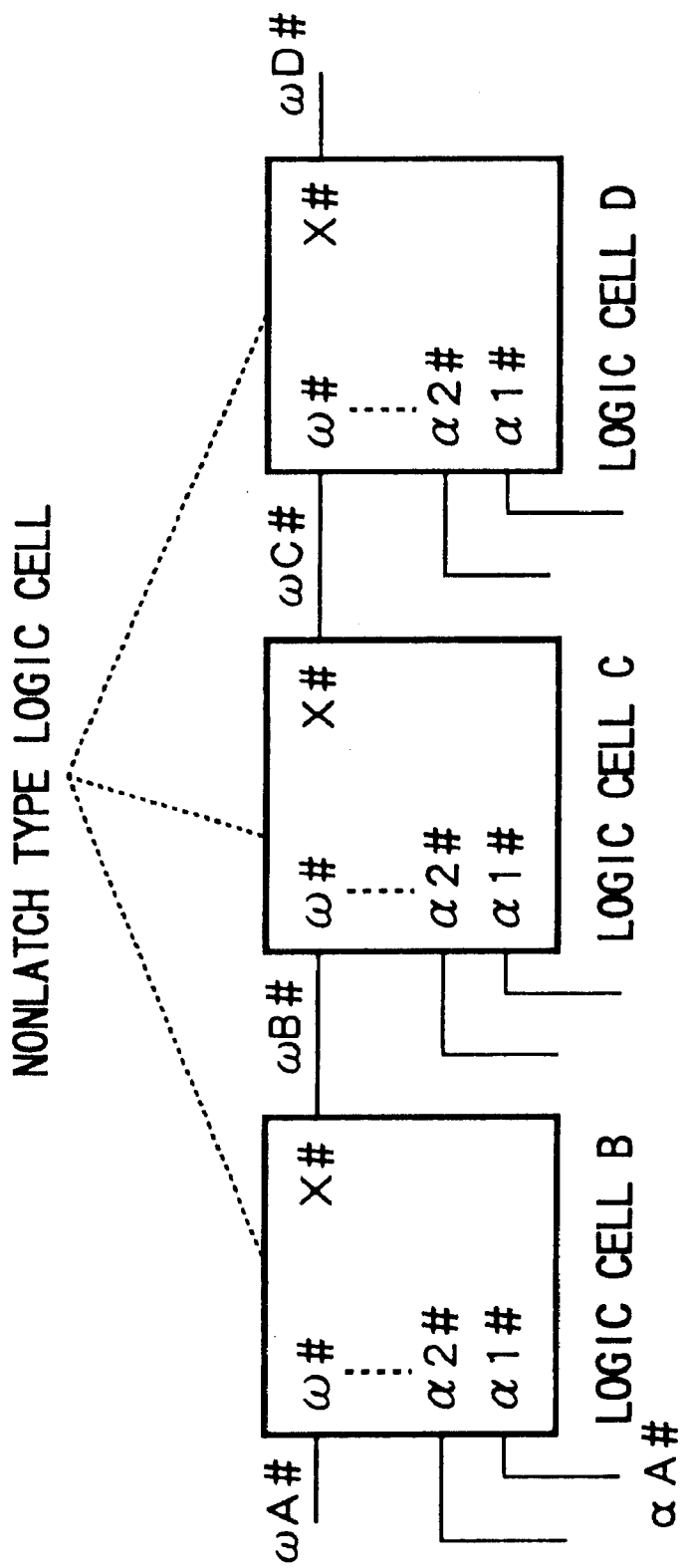
FIG. 21 is a circuit diagram of an example of a logic circuit configured by the logic cells of the present invention.

FIG. 21 shows an example of the logic circuit configured by nonlatch type logic cells B, C, and D. FIG. 22 is a waveform diagram showing the waveform of the signal when the related logic circuit performs the operation.

In the conventional logic circuit, the output of a certain logic cell must be maintain until the output of the logic cell at the terminal end is decided. In the logic circuit configured by using logic cells of the present invention, however, if the output of the logic cell of the vicinity is decided, even if the output of the certain logic cell is canceled, a logical erroneous operation does not occur. Below, this will be explained in further detail by referring to FIG. 21.

For example, in FIG. 21, the earliest signal αA# and the latest signal ωA# are input to a logic cell B. Note that, although not illustrated, one or more signals are input to the logic cell B between the signals αA# and ωA#.

ωA# input at a certain point of time holds the first logic code A1. Irrespective of the fact that the output signal ωD# at the terminal end has not yet been decided, it shifts to the blank code in the middle, and new data A2 is continuously input.

The logic cell B performs a logic evaluation (logic operation) when the input signal ωA# becomes the logic code A1 and outputs the logic code B1 to ωB#. Even if a signal αA# or the like other than ωA# shifts to the blank code in the middle, the output signal ωB# of the logic cell B is maintained.

The logic cell C performs a logic evaluation when the output signal ωB# of the output cell B becomes a logic code B1 and outputs a logic code C1 to ωC#. Upon receipt of this, the logic cell D can start the logic evaluation.

Here, the logic code on ωA# is shifted to the blank code. When a certain time has passed, even at the instant when the output ωB# of the logic cell B shifts to the blank code, the input ωC# of the logic cell D maintains the logic code. The logic cell D performs the logic evaluation during this time, and as a result of the evaluation, decides the output signal ωD#. This operation result ωD# is transferred to the latter stage.

Figure 22:
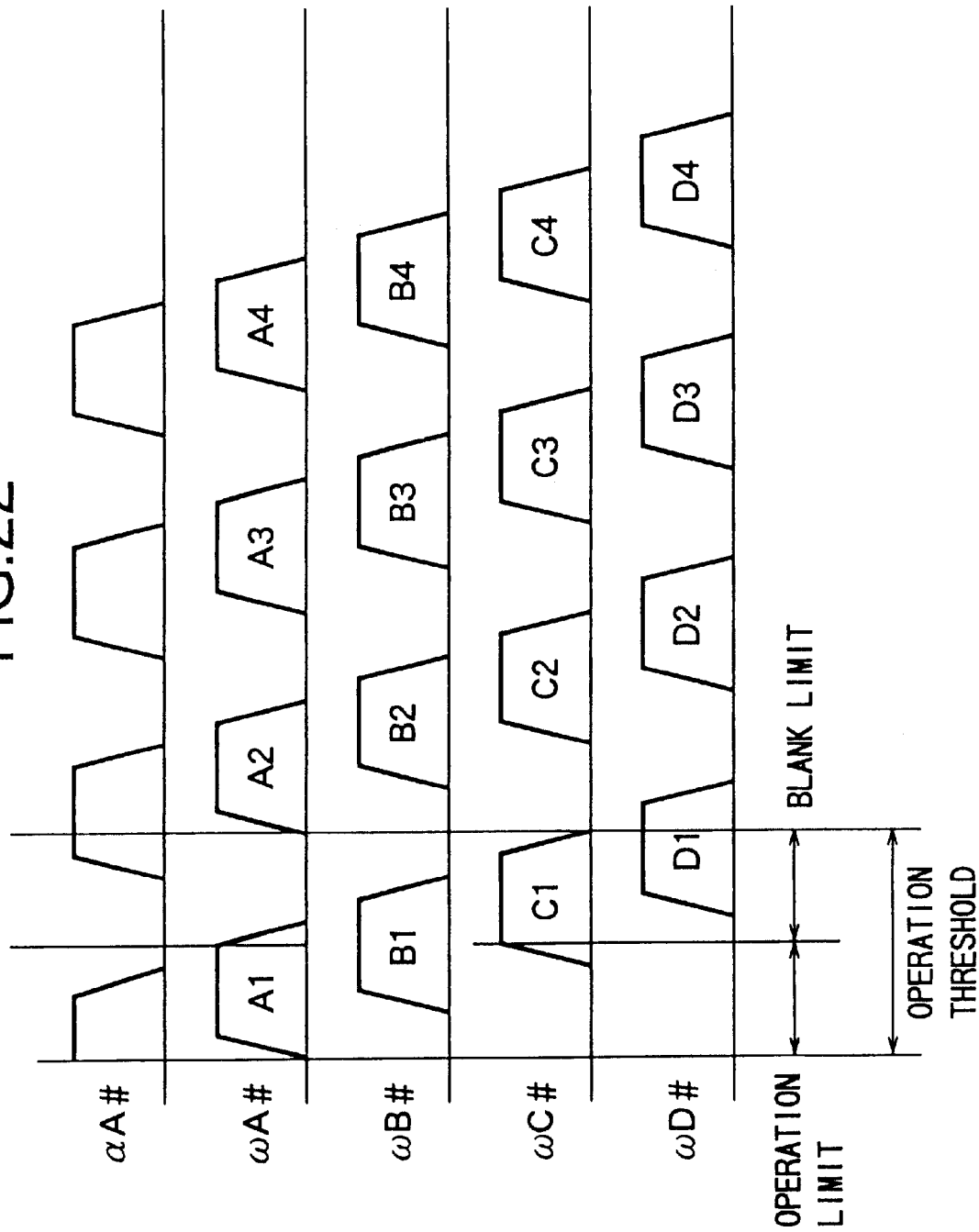
FIG. 22 is a waveform diagram showing the operation of the logic circuit shown in FIG. 21.

As mentioned above, during the time from when the input ωA# of the logic cell B shifts to the logic code A1 to when the output of the logic cell C for performing the logic operation by using the output ωB# of the related cell as the input signal shifts to a logic code, that is, in the time of "operation limit" shown in FIG. 22, if the logic code A1 is maintained, the operation result is propagated in succession, and new operations can be started in succession after the blank code is inserted.

Further, the time from when the input signal ωA# of the logic cell B becomes the blank code to when the output signal ωC# of the logic cell C becomes the blank code is defined as a "blank limit". This time is substantially equal to the operation limit. The sum of the operation limit and the blank limit is defined as an "operation threshold". This means the minimum operation time of the cell (logic cell B).

The reason why it is sufficient to consider only the propagation of a ω*# signal input to each logic cell (for example ωA# input to the logic cell B, ωB# input to the logic cell C, and ωC# input to the logic cell D) in this way is that these ω*# signals are signals arriving latest at the logic cells.

In the above explanation, it is assumed that the operation thresholds of the logic cells are equal. In actuality, however, the operation thresholds of the logic cells are slightly different according to the sizes of the logic tree circuits in the logic cells. Accordingly, the maximum operation threshold among a plurality of logic cells configuring one operation circuit is defined as the operation threshold of the entire operation circuit.

Figure 23:
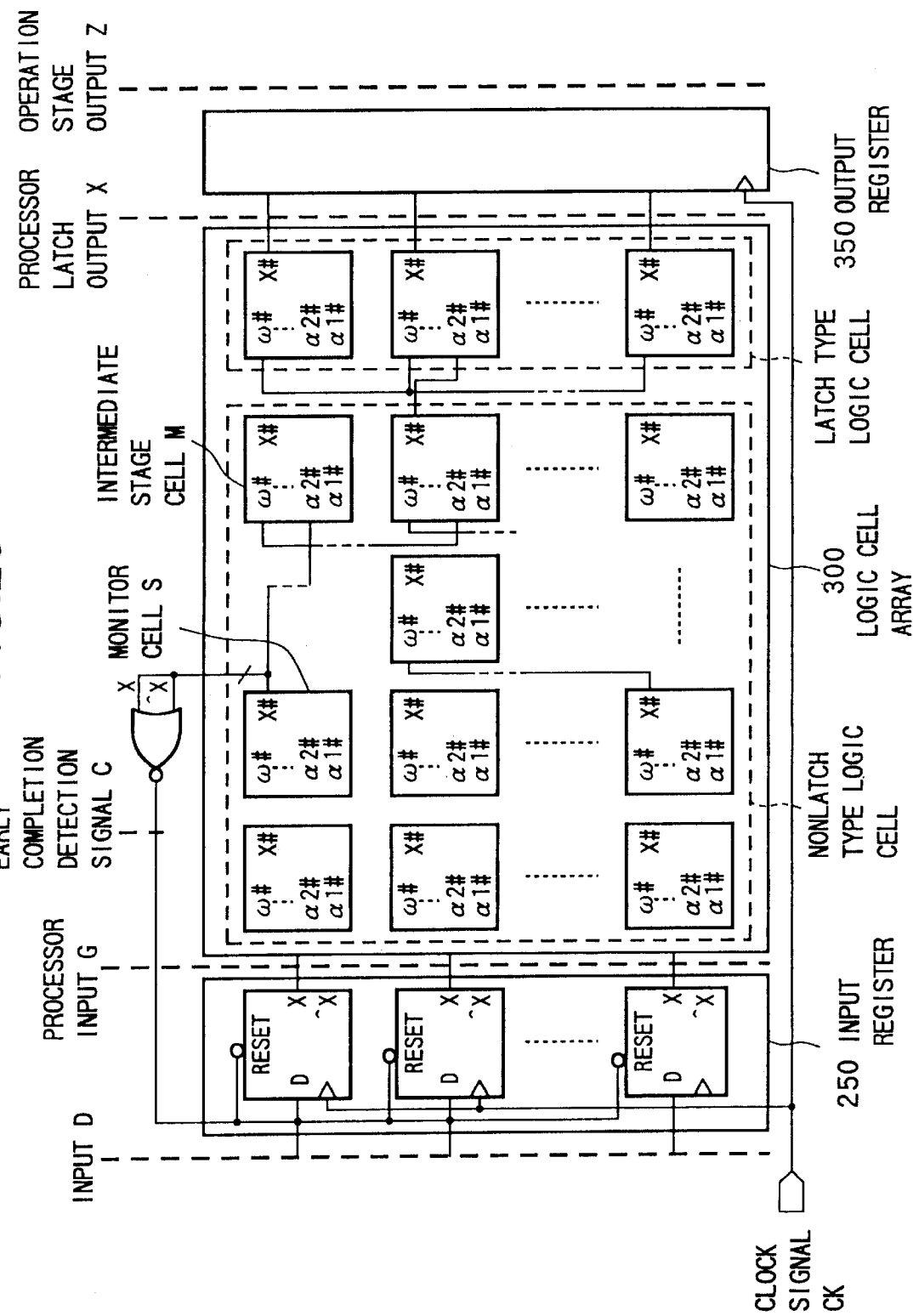
FIG. 23 is a circuit diagram of an embodiment of the operation circuit of the present invention.

FIG. 23 shows an embodiment of the operation circuit of the present invention. The operation circuit of the present embodiment is configured by an input register 250, a logic cell array 300, and an output register 350.

The input register 250 is configured by using a plurality of flip-flops 200 shown in FIG. 19A. These flip-flops convert the bits of the input data D to the two-wire two-phase type data used in the logic operation cell of the present invention and input the same to the predetermined logic cells configuring the logic cell array 300.

The logic cell array 300 is a logic operation circuit configured by a plurality of logic cells. Each logic cell is configured by the output circuit and the logic tree circuit as shown in FIG. 2. Here, a logic cell configured by a latch type output circuit and a logic tree circuit is referred to as a latch type logic cell, while a logic cell configured by a nonlatch type output circuit and a logic tree circuit is referred to as a nonlatch type logic cell. Among the logic cells configuring the logic cell array 300, the initial and intermediate logic cells are configured by nonlatch type logic cells, and the last logic cell is configured by a latch type logic cell. No pipeline register is provided between the logic cells.

The output register 350 is configured by a conventional flip-flop, holds the operation results of the logic cell array 300, and outputs the same to the outside.

The operation circuit of the present invention having the above configuration does not require the pipeline register essential for the conventional data path pipeline between logic cells configuring the logic cell array 300, so can realize a high speed logic operation.

As mentioned above, the operation circuit of the present invention has a unique operation threshold time. In order to make the operation circuit operate at a high speed for a time close to this, a mechanism for switching all of the inputs of the operation circuit to blank codes when the operation limit time has passed is necessary. One realizing this is an early completion monitor cell (hereinafter, simply referred to as a monitor cell) S shown in FIG. 23 and a 2-input NOR gate NR connected to that.

The monitor cell S selects the logic cell having a delay of a time substantially equal to the operation time limit of the logic operation circuit (logic cell array 300) per se estimated in advance from the logic cells of the logic cell array 300. It is determined irrelevant to the fact that the cell per se prescribes the maximum operation threshold of the logic cell array 300. Together with the rising edge of the clock signal CK, the data input to the logic cell array 300 switches from the blank code to a logic code, and the operation is started. The logic cells start their operations in succession from the side nearest the input, and logic codes are output in succession. When the operation limit time of the logic cell array 300 per se has passed, there are many logic cells having outputs shifting from the blank code to a logic code. One such logic cell is suitably selected and defined as the monitor cell S.

Below, an explanation will be made of the operation of the monitor cell S and the NOR gate NR.

First, when the output of the monitor cell S is the blank code, the output of the NOR gate NR is the logic 1. After the start of the operation, when the output of the monitor cell S shifts from the blank code to a logic code, the output of the NOR gate NR changes from 1 to 0. The output of the NOR gate NR (referred to as the early completion monitor signal C) is supplied to the flip-flops configuring the input register as the reset signal RST of the input register 250, therefore the input register 250 is reset in accordance with this and all inputs of the logic cell array 300 become the blank codes.

The blank codes output from the input register 250 are sequentially propagated in the logic cell array 300. When the output of the monitor cell S switches to the blank code, the output of the NOR gate NR switches from 0 to 1, and the reset of the input register 250 is released. Then, at the next rising edge of the clock signal CK, each bit of the input data D is fetched into the input register 250, converted to a two-wire two-phase type code, and input to the logic cell array 300.

As described above, the logic cell array 300 per se can cancel the contents of the input register by the monitor cell S and insert the blank code. For this reason, if the method of selection of the monitor cell is suitable, the required minimum level of operation limit time and operation threshold time can be obtained. In actuality, there are delay times of the NOR gate NR and the flip-flops configuring the input register 250, therefore it is suitable if a logic cell having a delay a little shorter than the operation limit time is selected as the monitor cell S.

Figure 24:
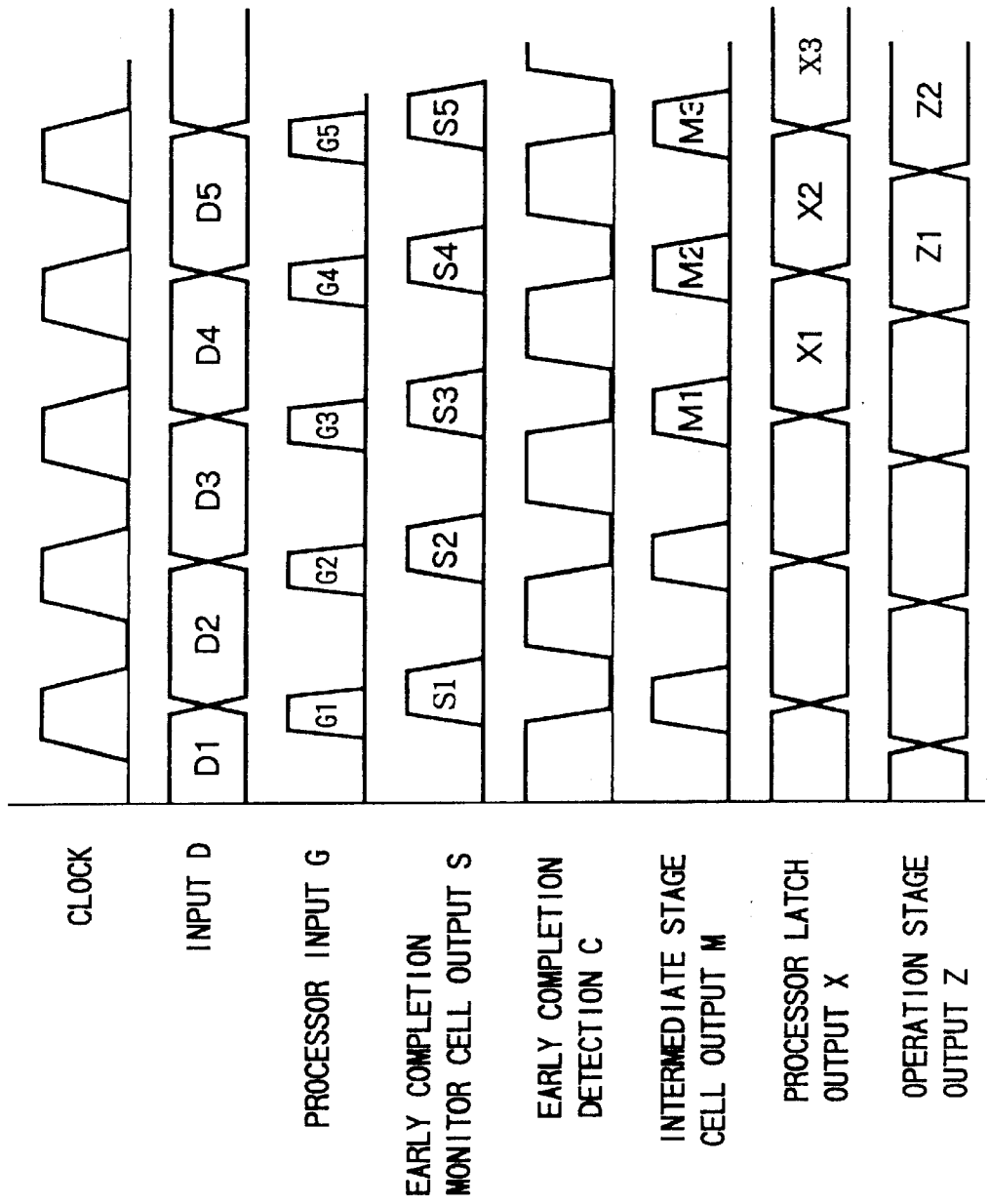
FIG. 24 is a waveform diagram showing the operation of the operation circuit of the present invention.

As shown in FIG. 23, no pipeline register is inserted in the logic cell array 300. However, the logic cell array 300 can realize a pipeline operation similar to an operation circuit having the conventional data path pipeline structure and can realize a logic operation higher in speed than that of the conventional one. FIG. 24 is a waveform diagram showing the operation of the logic circuit shown in FIG. 23. Below, a detailed explanation will be made of the operation of the logic circuit of the present invention by referring to FIG. 23 and FIG. 24.

First, block circuit input data D comprised by the usual single-phase synchronization logic is sent synchronous to the clock signal CK. The input register 250 converts this input data D to the two-wire two-phase data and fetches new data for every clock synchronous to the clock signal CK. When an output G of the input register switches from the blank code to a logic code synchronous to the clock signal CK, the predetermined logic operation is started in the logic cell array 300.

When the output of the monitor cell S selected in the middle of the logic cell array 300 changes from the blank code to a logic code, the output of the related monitor cell S also changes from the blank code to the logic code. At this time, the early completion detection signal C falls, and the input register 250 is reset. As a result, the input of the logic cell array 300 becomes the blank code and the array is prepared for a new operation.

As shown in FIG. 24, the input data D is input in an order of D1, D2, D3, . . . synchronous to the rising edge of the clock signal CK. The input data is input to the logic cell array 300 in an order of G1, G2, G3, . . . synchronous to the clock signal CK. When the data input to the logic cell array 300 is propagated by the logic cells and the input of the monitor cell S shifts from the blank code to a logic code, the output data early completion detection signal C of the NOR gate NR falls, the input register is reset in accordance with this, and all inputs to the logic cell array 300 become the blank code. When the blank code is propagated in the logic cell array 300 and the input of the monitor cell S becomes the blank code, the output of the NOR gate NR becomes 1, and the reset of the input register is released, so the next input data is input to the logic cell array 300 via the input register at the next rising edge of the clock signal CK.

As shown in FIG. 24, all of the output waveforms of the logic cells resemble the waveform of the output of the monitor cell S. Namely, they become waveforms having a width satisfying the operation threshold. For this reason, the operation data can be propagated in succession and finally reaches the last stage.

In the example of the waveforms shown in FIG. 24, an operation result Z1 of the data D1 fetched by a first clock is output from the output register after an elapse of three clocks. Namely, this operation circuit performs one operation by taking a time longer than the cycle of one clock (the time from the rising of G1 to the rising of X1 is the time for performing one operation in FIG. 24). By the characteristic feature of the logic cell of the present invention, operation processing of a so-called pipeline structure starting a new operation for every clock and outputting the operation result for every clock is possible. For this reason, high speed operation processing can be realized. Further, it is not necessary to provide any pipeline register in the logic cell array 300, therefore the restriction of the operation speed by the pipeline registers is eliminated, and a higher speed logic operation than the operation circuit of the conventional pipeline structure can be realized.

Summarizing the effects of the invention, as explained above, according to the logic circuit of the present invention, the operation of a data path pipeline can be realized without inserting the conventional pipeline registers between the logic cells. For this reason, the delay time due to the pipeline registers and the hardware overhead which were the problems of the conventional pipeline structure operation circuit can be eliminated, and simplification of the circuit and an increase of speed of the operation can be realized.

In the operation circuit of the present invention, the operation threshold is substantially equal to two logic cells' worth of the operation time. For this reason, the operating frequency can be made extremely high. When it is desired to realize an operating frequency the same as that by a conventional static CMOS logic, a pipeline register must be inserted at intervals of one to two logic circuits. In this case, a half or more of the period is consumed by the delay time of the pipeline registers, therefore in addition to the limit in the improvement of the operating speed, the size of the circuit becomes large and the circuit becomes impractical from the viewpoints of the number of gates and the power consumption. There is an advantage by the operation circuit of the present invention that these problems can all be solved and an operation circuit of a high speed and low power consumption can be realized.

While the invention has been described by reference to specific embodiments chosen for purposes of illustration, it should be apparent that numerous modifications could be made thereto by those skilled in the art without departing from the basic concept and scope of the invention.

What is claimed is:

1. A logic cell for, being one of an array of logic cells with each receiving a signal held by an input register, said logic cell performing a predetermined logic operation in accordance with a plurality of input signals, comprising
   a logic tree circuit having a plurality of switching elements connected between an output node and a reference potential, said switching element arranged nearest to said reference potential being controlled by a signal arriving earliest among said plurality of input signals, and said switching element arranged nearest to said output node being controlled by a signal arriving latest among said plurality of input signals, and an output circuit connected to said output node and outputting the signal of said output node in accordance with the signal arriving latest among said plurality of input signals, wherein said logic tree circuit is formed by Shannon expansion of said plurality of input signals in order from the latest arrival.

2. A logic cell as set forth in claim 1, wherein said output circuit has a latch circuit for holding the signal level of said output node.

3. A logic cell as set forth in claim 1, wherein said switching element includes a transistor receiving said input signal at a control terminal.

4. amended to include the subject matter of its base claim 1) A logic cell for, being one of an array of logic cells with each receiving a signal held by an input register, said logic cell performing a predetermined logic operation in accordance with a plurality of input signals, comprising a logic tree circuit having a plurality of switching elements connected between an output node and a reference potential, said switching element arranged nearest to said reference potential being controlled by a signal arriving earliest among said plurality of input signals, and said switching element arranged nearest to said output node being controlled by a signal arriving latest among said plurality of input signals, and an output circuit connected to said output node and outputting the signal of said output node in accordance with the signal arriving latest among said plurality of input signals, wherein said input register converts each input signal to a pair of signals, and each signal pair takes at least three logic states of a logic 0 (0, 1) a logic 1 (1, 0), and a blank (0, 0).

5. A logic cell as set forth in claim 4, wherein when the input signal arriving the latest takes said blank state, the output circuit outputs a signal indicating said blank state.

6. A logic cell as set forth in claim 4, wherein when the input signal arriving the latest takes said blank state, the output circuit outputs the operation result immediately before that.

7. A logic circuit comprising an input register for holding a plurality of input signals;

a logic operation circuit comprising a plurality of logic cells each receiving a signal held by said input register, performing a predetermined logic operation, and outputting operation results to the next logic cell;

an output register for holding and outputting the output signal of a last logic cell; and a reset circuit for resetting said input register when the output signal of a monitor use logic cell selected from among said plurality of logic cells is in a predetermined state in accordance with the output of the monitor use logic cell;

said logic cell comprising:

a logic tree circuit having a plurality of switching elements connected between an output node and a reference potential, said switching element arranged nearest to said reference potential being controlled by a signal arriving earliest among the plurality of input signals, and said switching element arranged nearest to said output node being controlled by a signal arriving latest among said plurality of input signals, and an output circuit connected to said output node and outputting the signal of said output node in accordance with the signal arriving latest among said plurality of input signals.

8. A logic circuit as set forth in claim 7, wherein said logic tree circuit is formed by Shannon expansion of said plurality of input signals in order from the latest arrival.

9. A logic circuit as set forth in claim 7, wherein said output circuit has a latch circuit for holding the signal level of said output node.

10. A logic circuit as set forth in claim 7, wherein said input register converts each input signal to a pair of signals, and each signal pair takes at least three logic states of a logic 0 (0, 1), a logic 1 (1,0), and a blank (0, 0).

11. A logic circuit as set forth in claim 10, wherein when the input signal arriving the latest takes said blank state, the output circuit of each logic cell other than the last logic cell outputs a signal indication said blank state.

12. A logic circuit as set forth in claim 10, wherein when the input signal arriving the latest takes said blank state, the output circuit of the last logic cell holds and outputs the operation result immediately before that.

13. A logic circuit as set forth in claim 10, wherein when the output of said monitor use logic cell takes a state other than said blank state, said reset circuit resets aid input register.

14. A logic circuit as set forth in claim 13, wherein when said input register is reset, all output signals are held at signals indicating said blank state.

15. A logic circuit as set forth in claim 7, wherein said switching element includes a transistor receiving said input signal at a control terminal.

* * * * *

UNITED STATES PATENT AND TRADEMARK OFFICE
CERTIFICATE OF CORRECTION

PATENT NO. : 6,496,041 B2
DATED : December 17, 2002
INVENTOR(S) : Koji Hirairi

It is certified that error appears in the above-identified patent and that said Letters Patent is hereby corrected as shown below:

<u>Column 15,</u>
Line 18, delete "amended to include the subject matter of its base claim 1)".

Signed and Sealed this

Third Day of February, 2004

JON W. DUDAS
*Acting Director of the United States Patent and Trademark Office*